(12) United States Patent
Liu et al.

(10) Patent No.: US 12,183,806 B2
(45) Date of Patent: Dec. 31, 2024

(54) SEMICONDUCTOR DEVICES AND METHODS OF FABRICATING THE SAME

(71) Applicant: Taiwan Semiconductor Manufacturing Company, Ltd., Hsin-Chu (TW)

(72) Inventors: Ko-Cheng Liu, Hsinchu (TW); Chang-Miao Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 406 days.

(21) Appl. No.: 17/732,140

(22) Filed: Apr. 28, 2022

(65) Prior Publication Data

US 2023/0352560 A1    Nov. 2, 2023

(51) Int. Cl.
*H01L 29/66* (2006.01)
*H01L 21/02* (2006.01)
*H01L 29/06* (2006.01)
*H01L 29/423* (2006.01)
*H01L 29/786* (2006.01)

(52) U.S. Cl.
CPC .... *H01L 29/66545* (2013.01); *H01L 21/0259* (2013.01); *H01L 29/0665* (2013.01); *H01L 29/42392* (2013.01); *H01L 29/66553* (2013.01); *H01L 29/66742* (2013.01); *H01L 29/78696* (2013.01)

(58) Field of Classification Search
CPC ........... H01L 29/66545; H01L 21/0259; H01L 29/0665; H01L 29/42392; H01L 29/66553; H01L 29/66742; H01L 29/78696; H01L 21/823481; H01L 27/088; H01L 29/0673; H01L 29/66439; H01L 29/6653; H01L 29/775; H01L 29/165; H01L 29/7848; B82Y 10/00
See application file for complete search history.

(56) References Cited

U.S. PATENT DOCUMENTS

| | | | |
|---|---|---|---|
| 11,145,734 B1 * | 10/2021 | Yu | H01L 21/823481 |
| 2013/0200458 A1 | 8/2013 | Anderson | |
| 2017/0338323 A1 | 11/2017 | Cheng | |

(Continued)

FOREIGN PATENT DOCUMENTS

| | | | | |
|---|---|---|---|---|
| CN | 113658952 A | * | 11/2021 | ......... H01L 21/0259 |
| TW | 202101546 A | | 1/2021 | |

*Primary Examiner* — Douglas W Owens
(74) *Attorney, Agent, or Firm* — HAYNES AND BOONE, LLP

(57) ABSTRACT

A semiconductor structure and a method of forming the same are provided. In an embodiment, an exemplary method includes providing a workpiece having a first active region and a second active region protruding from a substrate, lined by cladding layers, and spaced by a first trench. The method also includes forming a dielectric layer over the workpiece to substantially fill the first trench, forming a mask film directly on a portion of the dielectric layer in the first trench after the forming of the dielectric layer, selectively recessing the dielectric layer after the forming of the mask film to form a dummy fin in and protruding from the first trench, performing an etching process to selectively remove the cladding layers to form second trenches, and forming a gate structure over the workpiece to fill the second trenches.

20 Claims, 29 Drawing Sheets

(56) References Cited

U.S. PATENT DOCUMENTS

| | | |
|---|---|---|
| 2020/0052086 A1* | 2/2020 | Yang ................... H01L 29/4991 |
| 2021/0057540 A1 | 2/2021 | Lai |
| 2021/0091179 A1* | 3/2021 | Wang ................ H01L 29/66469 |
| 2021/0265349 A1* | 8/2021 | Chung ............ H01L 21/823821 |
| 2022/0285346 A1* | 9/2022 | Li .................... H01L 21/823807 |
| 2023/0282723 A1* | 9/2023 | Lin ....................... H01L 27/088 |
| | | 257/401 |
| 2023/0420505 A1* | 12/2023 | Chen ............... H01L 21/823481 |

* cited by examiner

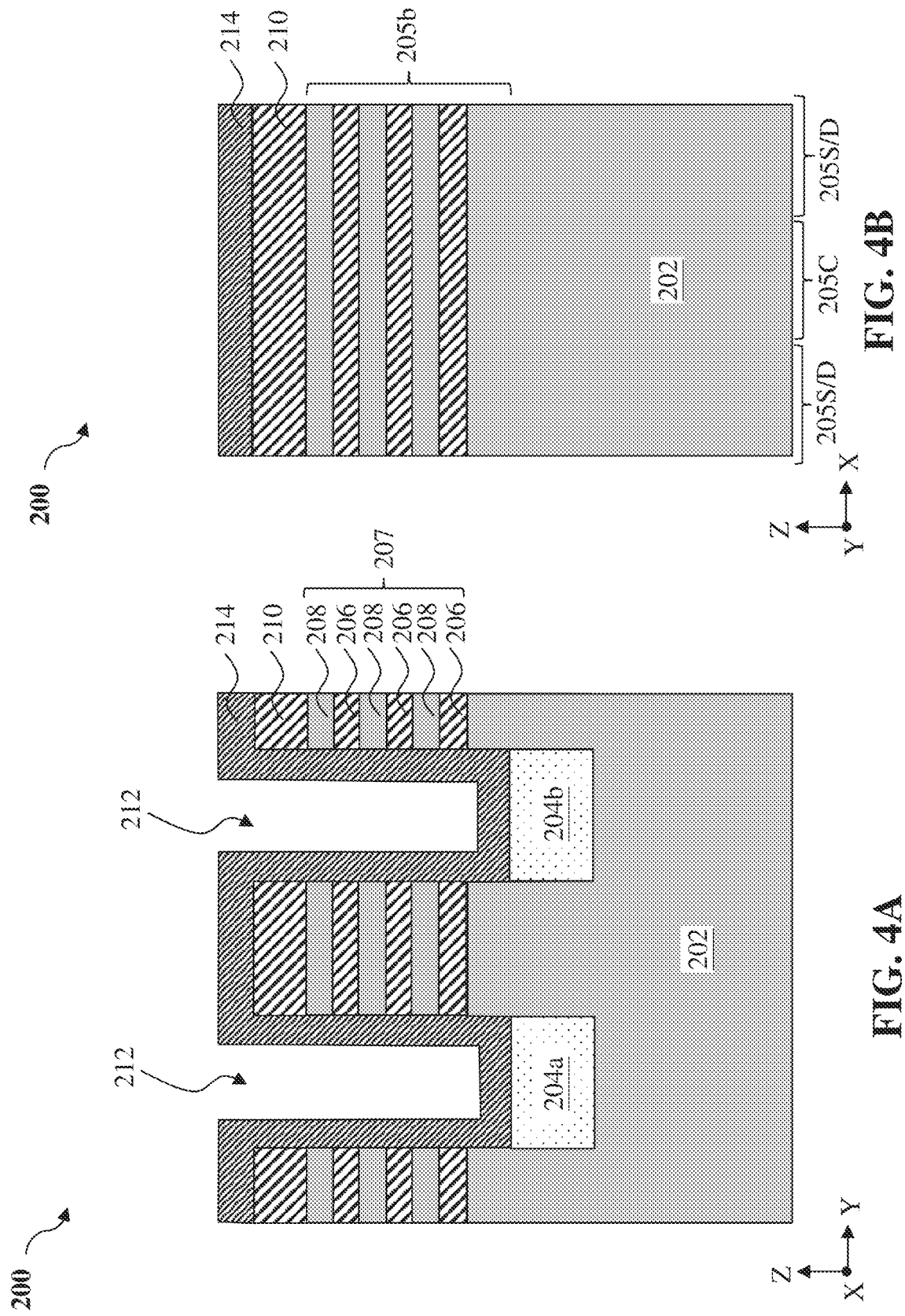

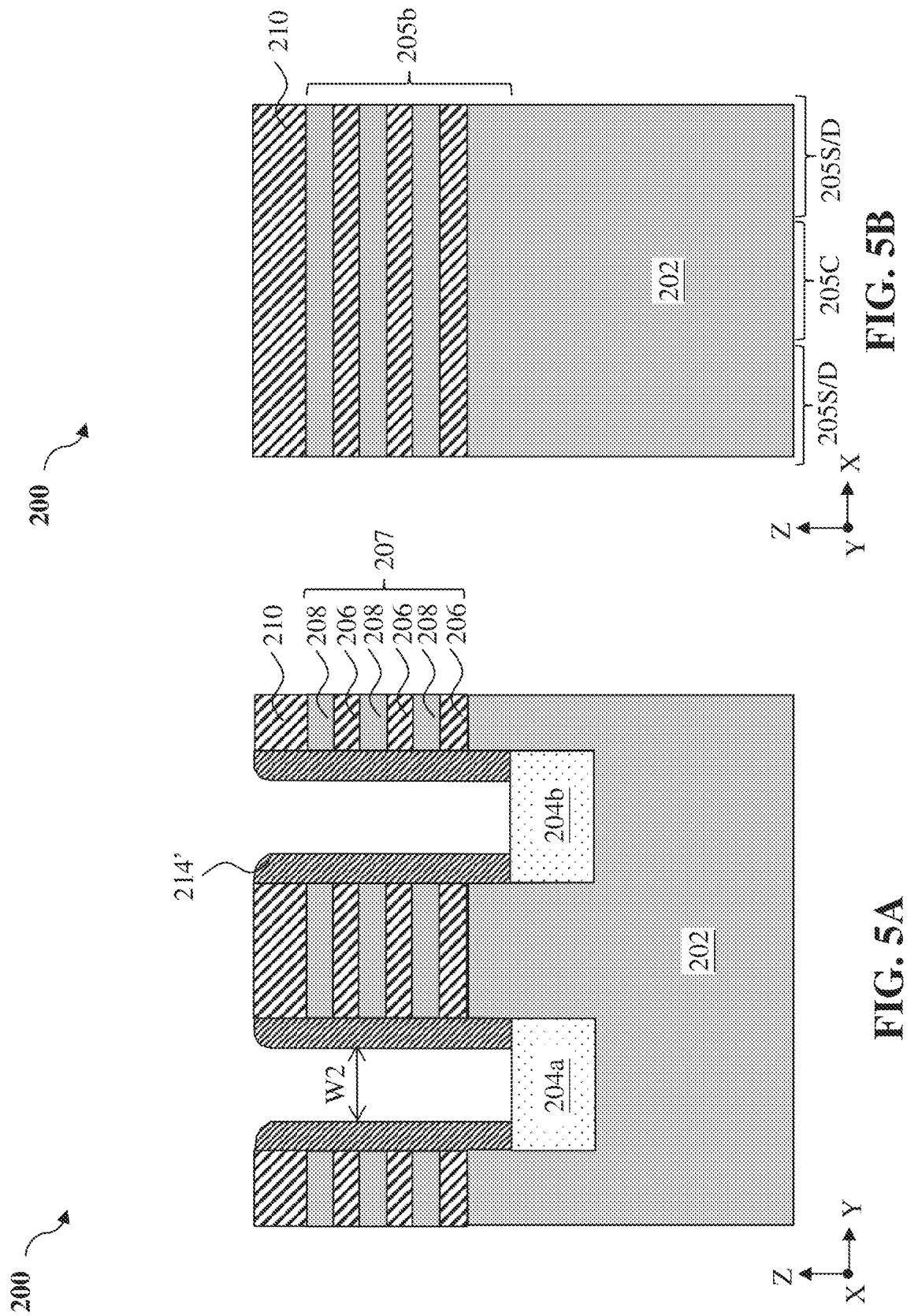

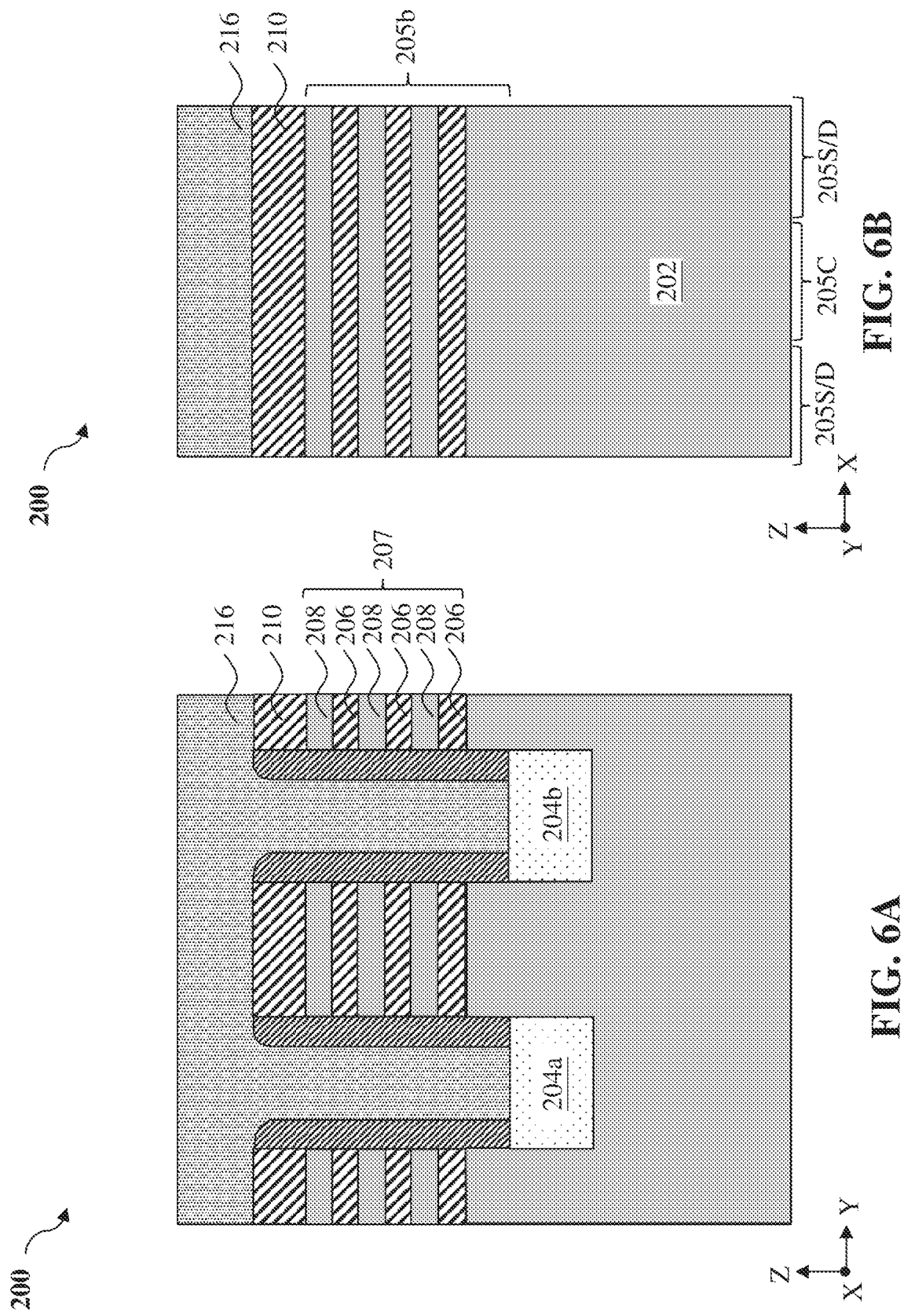

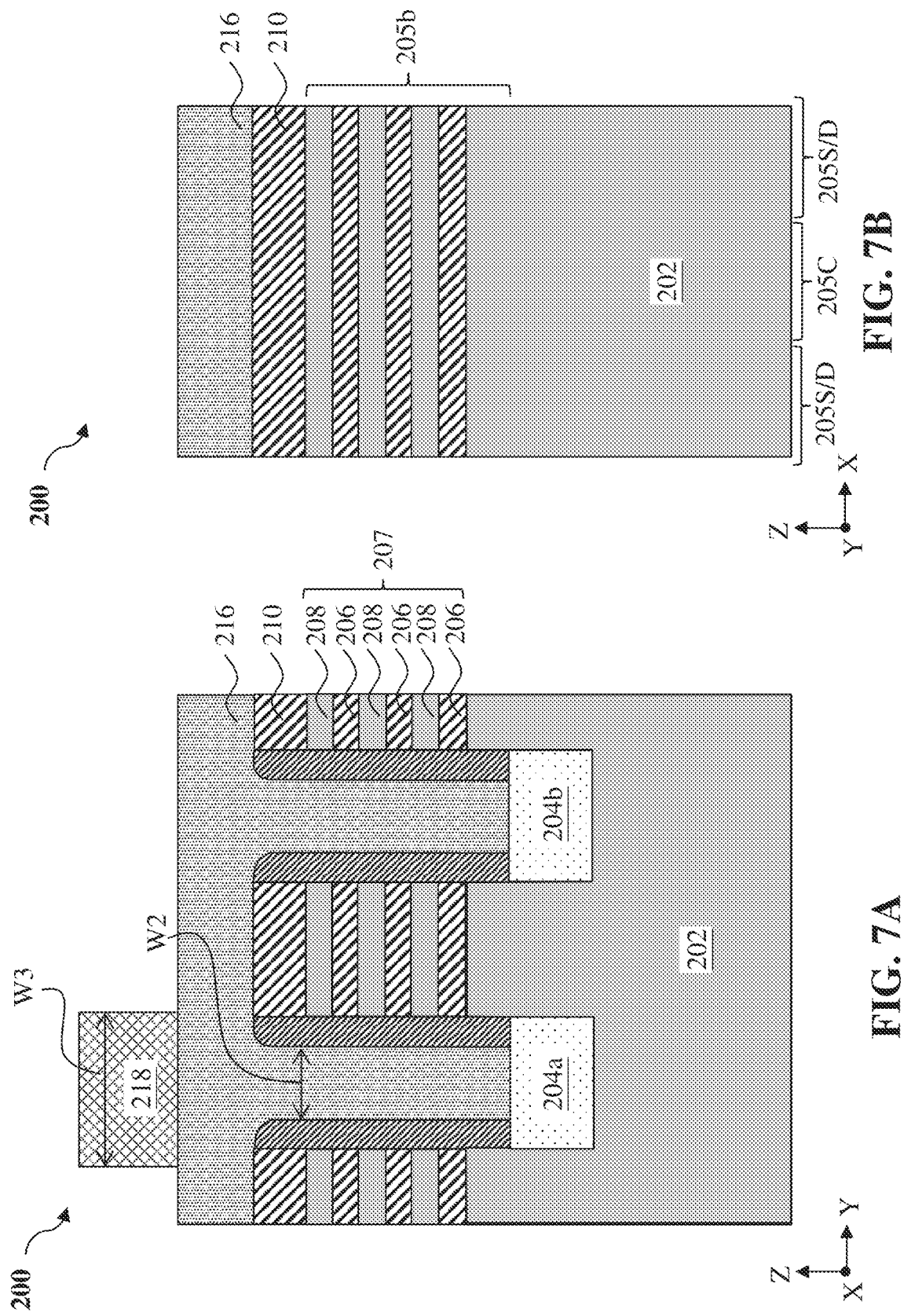

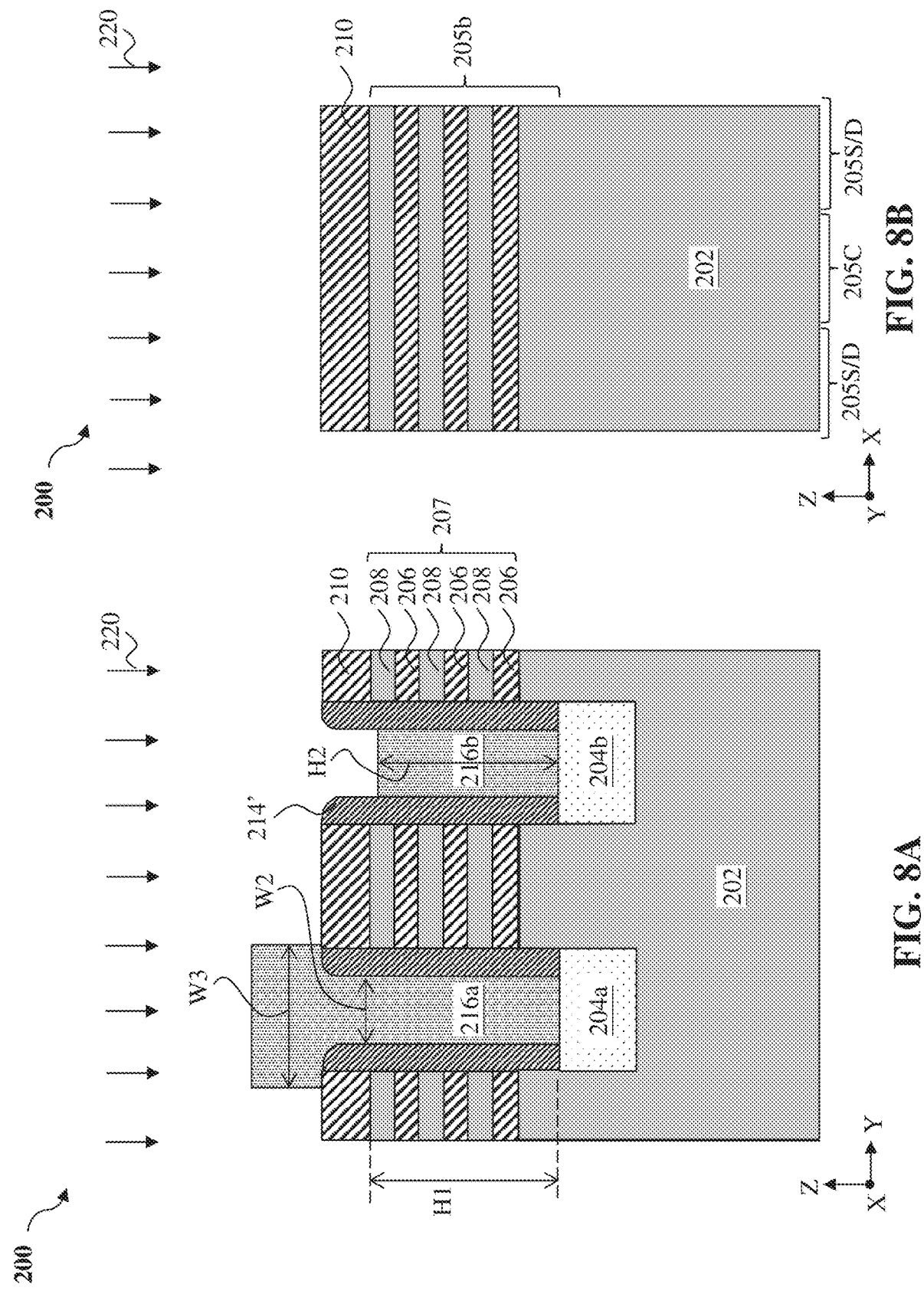

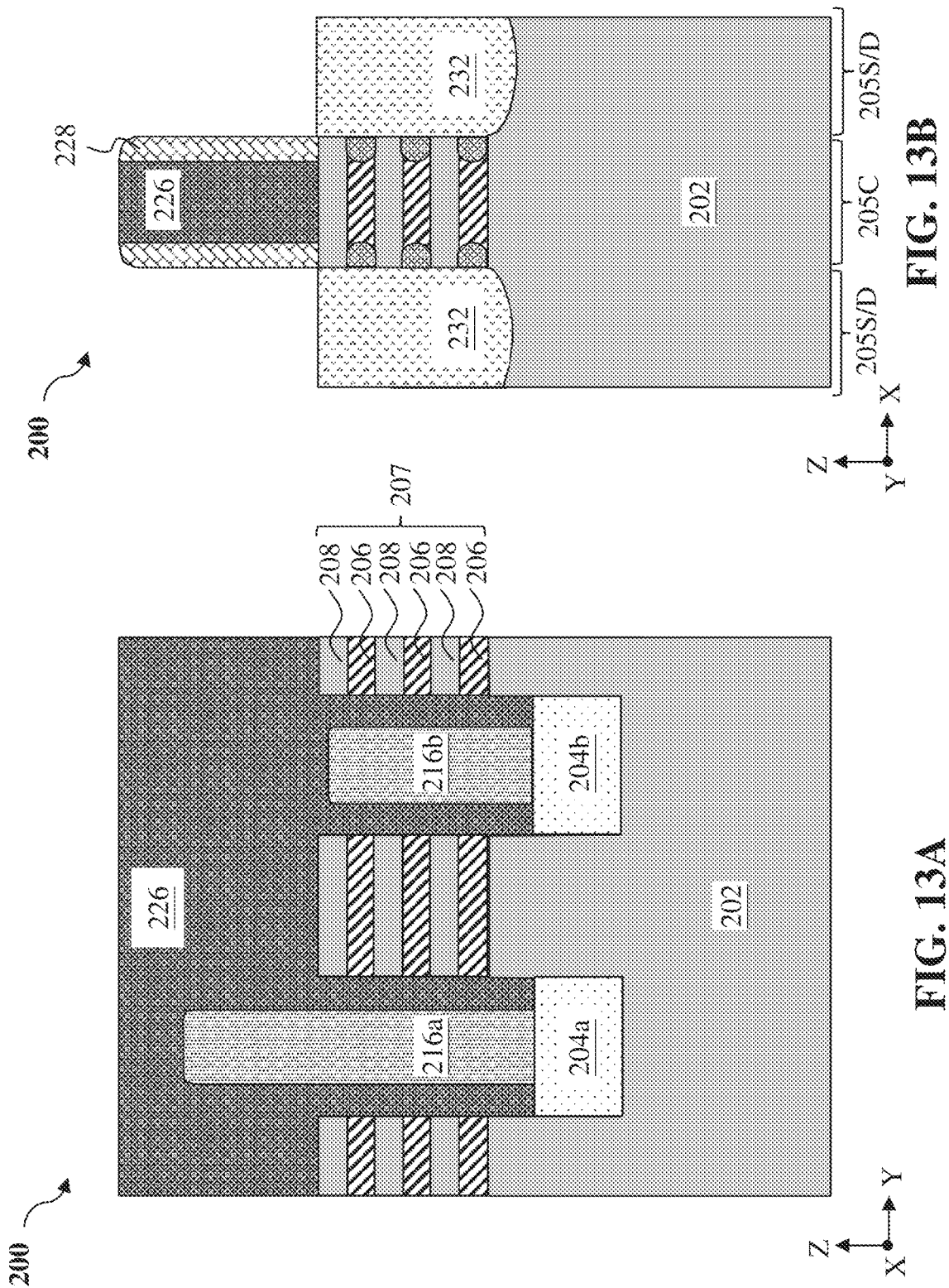

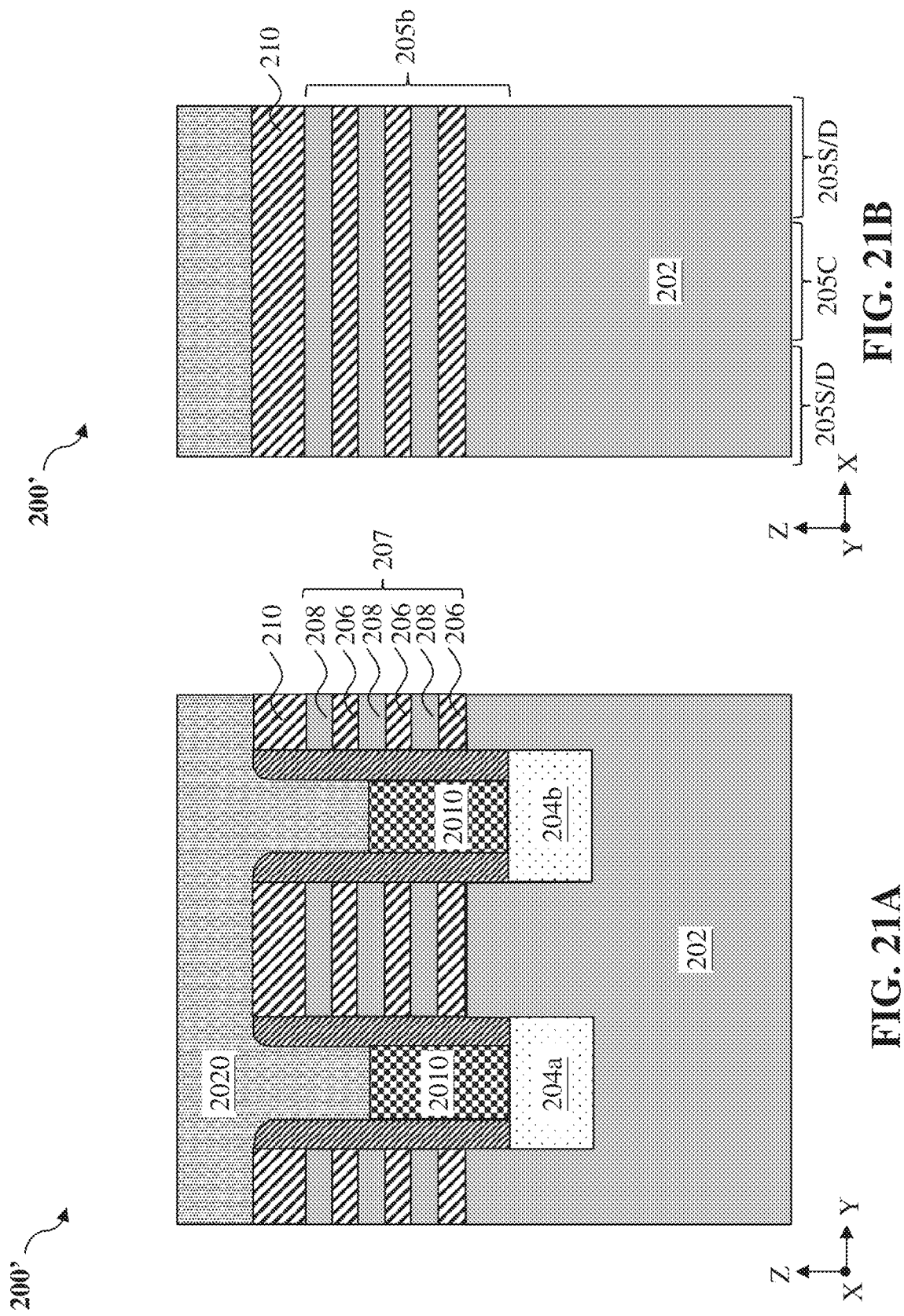

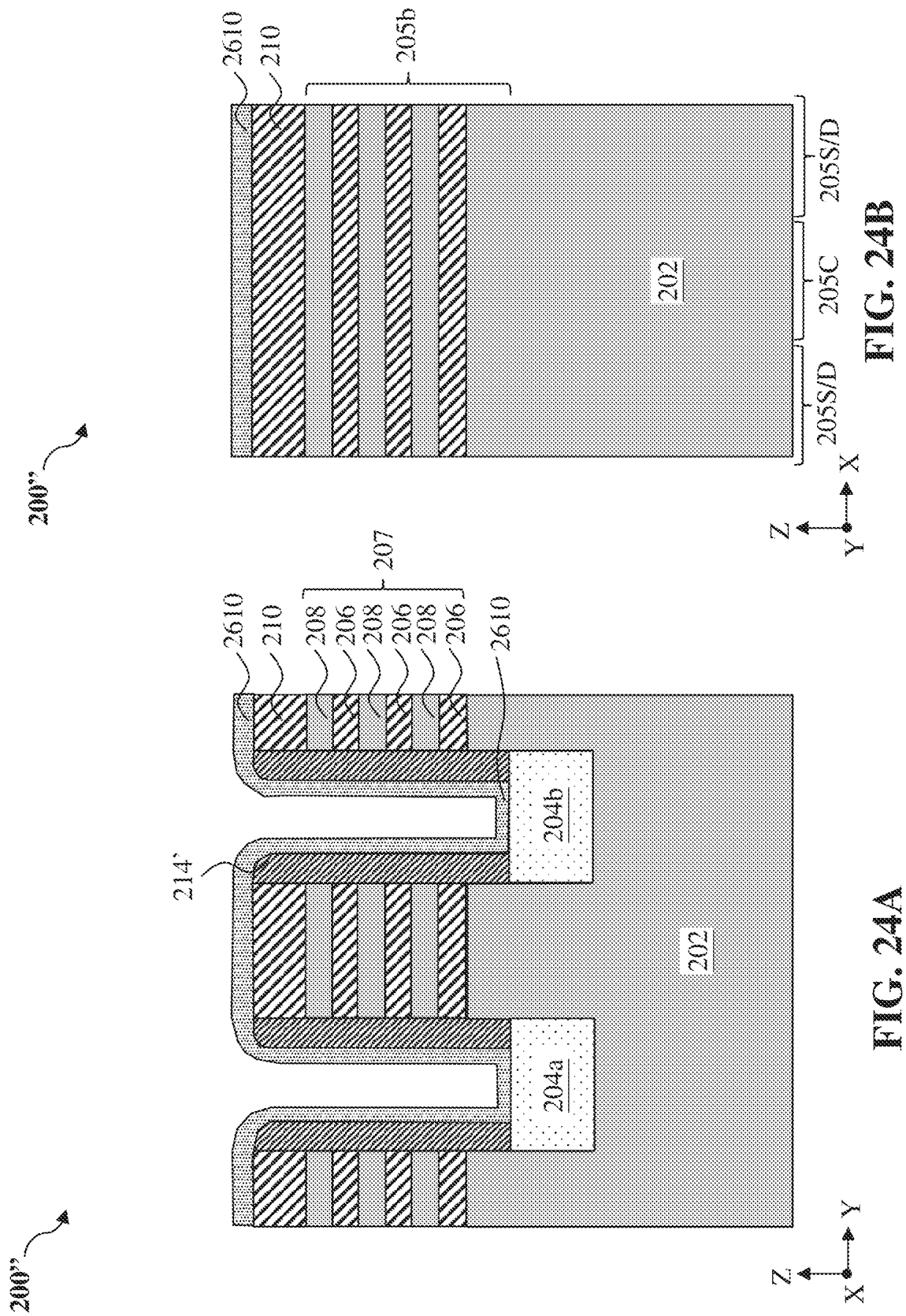

SEMICONDUCTOR DEVICES AND METHODS OF FABRICATING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as semiconductor devices continue to scale, challenges arise in achieving desired density and performance. The desired density and performance also demand effective and precise etching process. However, due to densely spaced features and reduced process windows, undesired portions of some dielectric features may not be substantially removed in a predetermined etching duration and some residues may remain, leading to degraded performance. While over-etching may reduce undesirable residual sacrificial features, adjacent features may suffer damages. In addition, parasitic capacitance of dielectric features disposed between active regions may have serious bearings on the overall performance of an IC device. In some examples, high parasitic capacitance may lead to lower device speed (e.g., RC delays) when separation distances between the active device regions reduces to meet design requirements of smaller technology nodes. Accordingly, although existing devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A, 15A, 16A (3A-16A) and 18A illustrate fragmentary cross-sectional views of the exemplary workpiece taken along line A-A' as shown in FIG. 2 during various fabrication stages in the method of FIG. 1, according to one or more aspects of the present disclosure.

FIGS. 3B, 4B, 5B, 6B, 7B, 8B, 9B, 10B, 11B, 12B, 13B, 14B, 15B, 16B (3B-16B) and 18B illustrate fragmentary cross-sectional views of the exemplary workpiece taken along line B-B' as shown in FIG. 2 during various fabrication stages in the method of FIG. 1, according to one or more aspects of the present disclosure.

FIGS. 20A, 21A, and 22A (20A-22A) illustrate fragmentary cross-sectional views of the exemplary workpiece taken along line A-A' as shown in FIG. 2 during various fabrication stages in the method of FIG. 19, according to one or more aspects of the present disclosure.

FIGS. 20B, 21B, and 22B (20B-22B) illustrate fragmentary cross-sectional views of the exemplary workpiece taken along line B-B' as shown in FIG. 2 during various fabrication stages in the method of FIG. 19, according to one or more aspects of the present disclosure.

FIGS. 24A, 25A, 26A, and 27A (24A-27A) illustrate fragmentary cross-sectional views of the exemplary workpiece taken along line A-A' as shown in FIG. 2 during various fabrication stages in the method of FIG. 23, according to one or more aspects of the present disclosure.

FIGS. 24B, 25B, 26B, and 27B (24B-27B) illustrate fragmentary cross-sectional views of the exemplary workpiece taken along line B-B' as shown in FIG. 2 during various fabrication stages in the method of FIG. 23, according to one or more aspects of the present disclosure.

DETAILED DESCRIPTION

Figure 1:
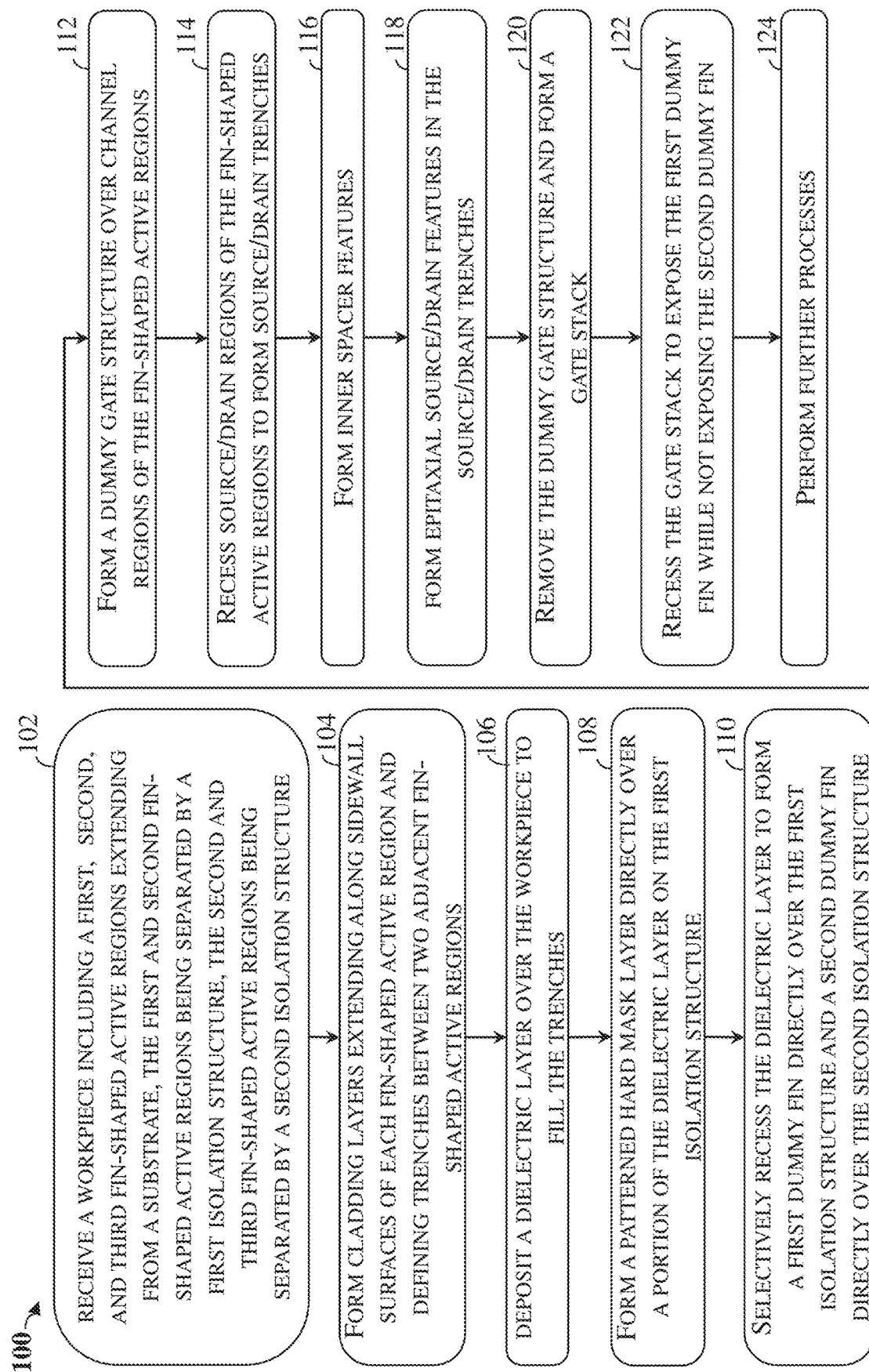
FIG. 1 illustrates a flowchart of an exemplary method for fabricating a semiconductor device, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

As integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

Formation of a FinFET or an MBC transistor includes patterning semiconductor material(s) into fin-shaped active regions, forming a dummy fin between two adjacent fin-shaped active regions to isolate source/drain features to be formed in source/drain trenches. That is, a composition of the dummy fin may be selected to resist etch loss during the formation of source/drain trenches. An isolation structure may be formed on the dummy fin and work together with the dummy fin to electrically cut a functional gate stack into two pieces. In situations where the functional gate stack is designed to couple two channel regions, the isolation structure formed on the dummy fin may be removed. That is, in some situations, the composition of the isolation structure may be selected such that the isolation structure may be easily removed. The selective removal of the isolation structure over the dummy fin may be challenging due to the complexity of structure environment.

The present disclosure provides semiconductor devices and methods for forming a dummy fin between two adjacent active regions. The dummy fin may be configured to have a satisfactory height such that a portion of a metal gate stack of the semiconductor device may be either isolated from or connected to an adjacent portion of the metal gate stack. In an exemplary embodiment, a method includes providing a first semiconductor fin, a second semiconductor fin, and a third semiconductor fin each protruding from a substrate and oriented lengthwise in a first direction, forming a dielectric feature over the substrate to fill a first trench between the first and second semiconductor fins and a second trench between the second and third semiconductor fins, selectively recessing the dielectric feature to form a first dummy fin in and protruding from the first trench and a second dummy fin in the second trench, where a height of the first dummy fin is greater than a height of the second dummy fin, after the forming of the first and second dummy fins, forming a placeholder gate over the first, second, and third semiconductor fins, where the first and the second dummy fins are embedded in the placeholder gate, forming source/drain trenches, forming source/drain features in the source/drain trenches, selectively removing the placeholder gate without substantially etching the first and second dummy fins, and forming a metal gate stack over the substrate. A top surface of the first dummy fin is above a top surface of the metal gate stack and a top surface of the second dummy fin is below a top surface of the metal gate stack.

The various aspects of the present disclosure will now be described in more detail with reference to the figures. In that regard, FIG. 1 is a flowchart illustrating method 100 of forming a semiconductor device 200 according to embodiments of the present disclosure. Method 100 is described below in conjunction with FIGS. 2, 3A-16A, 3B-16B, 12C-13C, 17, 18A-18B which are fragmentary top views or cross-sectional views of a workpiece 200 at different stages of fabrication according to embodiments of method 100. FIG. 19 is a flowchart illustrating method 100' of forming a semiconductor device 200' according to embodiments of the present disclosure. Method 100' is described below in conjunction with FIGS. 20A-22A and 20B-22B which are fragmentary cross-sectional views of a workpiece 200' at different stages of fabrication according to embodiments of method 100'. FIG. 23 is a flowchart illustrating method 100" of forming a semiconductor device 200" according to embodiments of the present disclosure. Method 100" is described below in conjunction with FIGS. 24A-27A and 24B-27B which are fragmentary cross-sectional views of a workpiece 200" at different stages of fabrication according to embodiments of method 100". Methods 100, 100', and 100" are merely examples and are not intended to limit the present disclosure to what is explicitly illustrated therein. Additional steps may be provided before, during and after the methods 100, 100', and 100" and some steps described can be replaced, eliminated, or moved around for additional embodiments of the method. Not all steps are described herein in detail for reasons of simplicity. Because the workpiece 200/200'/200" will be fabricated into a corresponding semiconductor device 200/200'/200" upon conclusion of the fabrication processes, the workpiece 200/200'/200" may be referred to as the semiconductor device 200/200'/200" as the context requires. For avoidance of doubts, the X, Y and Z directions in the figures are perpendicular to one another and are used consistently throughout the figures. Throughout the present disclosure, like reference numerals denote like features unless otherwise excepted.

Figure 2:
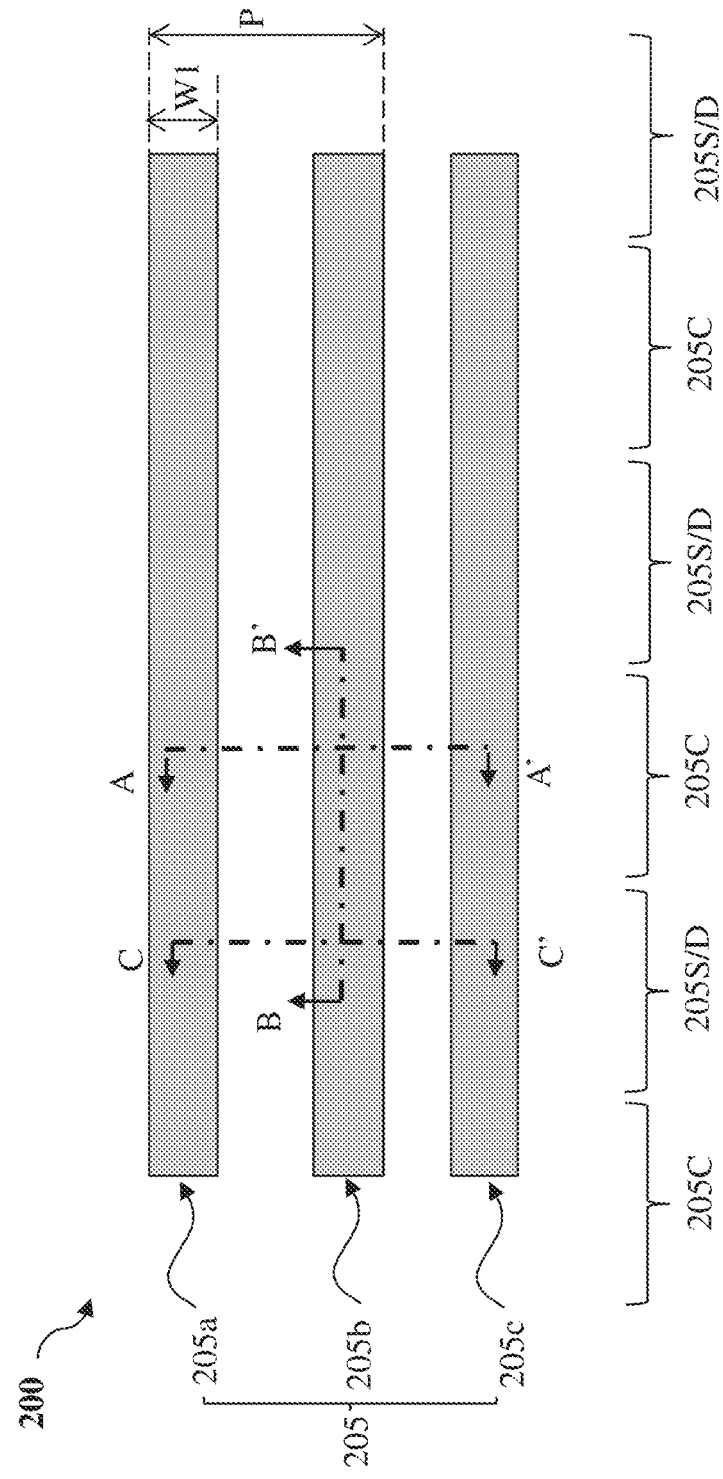
FIG. 2 is a fragmentary planar top view of an exemplary workpiece to undergo various stages of operations in the method of FIG. 1, according to various aspects of the disclosure.
Figures 3A, 3B:
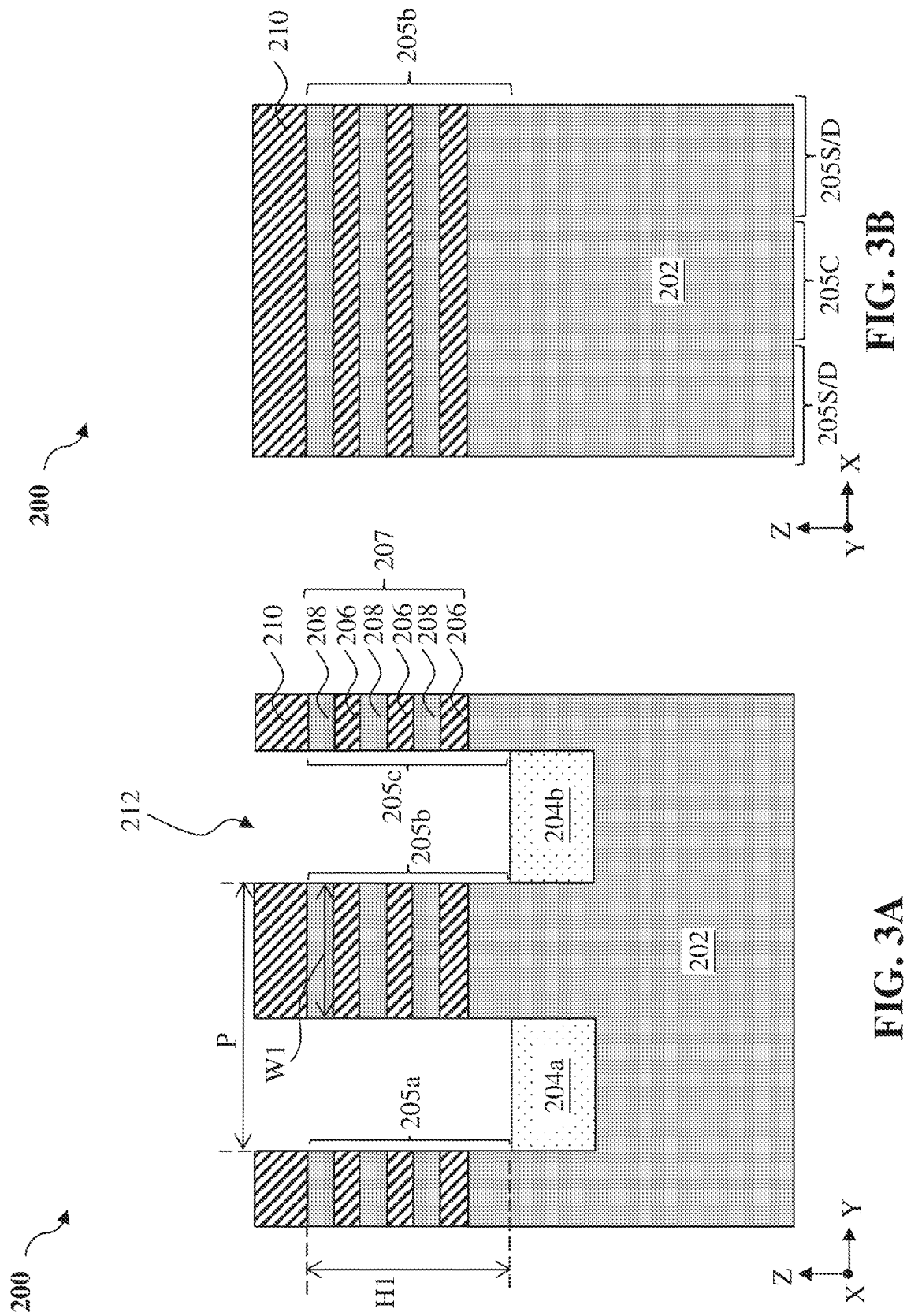

Referring to FIGS. 1, 2, 3A and 3B, method 100 includes a block 102 where a workpiece 200 is received. FIG. 2 depicts a top view of an exemplary workpiece 200, FIG. 3A depicts a cross-sectional view of the workpiece 200 taken along line A-A' as shown in FIG. 2, and FIG. 3B depicts a cross-sectional view of the workpiece 200 taken along line B-B' as shown in FIG. 2. The workpiece 200 may be an intermediate device fabricated during processing of an IC, or a portion thereof, that may comprise static random-access memory (SRAM) and/or other logic circuits, passive components such as resistors, capacitors, and inductors, and active components such as MBC transistors, FinFETs, metal-oxide semiconductor field effect transistors (MOSFETs), complementary metal-oxide semiconductor (CMOS) transistors, bipolar transistors, high voltage transistors, high frequency transistors, and/or other transistors. In the present embodiments, the workpiece 200 includes one or more MBC transistors. Additional features can be added to the workpiece 200, and some of the features described below can be replaced, modified, or eliminated in other embodiments of the workpiece 200.

In embodiments represented in FIGS. 3A and 3B, the workpiece 200 includes a substrate 202. In an embodiment, the substrate 202 is a bulk silicon substrate. The substrate 202 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator (SGOI) substrate, or a germanium-on-insulator (GeOI) substrate.

Still referring to FIGS. 2, 3A and 3B, the workpiece 200 includes a first fin-shaped active region 205a, a second fin-shaped active region 205b, and a third fin-shaped active region 205c disposed over the substrate 202. The first, second, and third fin-shaped active region 205a-205c may be separately or collectively referred to as a fin-shaped active region 205 or fin-shaped active regions 205. Each of the fin-shaped active regions 205 extends lengthwise along the X direction and is divided into channel regions 205C and sources/drain regions 205S/D. In an embodiment, a height H1 (shown in FIG. 3A) of the fin-shaped active region 205 may be between about 50 nm and about 60 nm. In an embodiment, a width W1 of the fin-shaped active region 205 along the Y direction may be between about 20 nm and about 30 nm. In an embodiment, a pitch P of the fin-shaped active regions 205 may be between about 60 nm and about 70 nm.

The fin-shaped active region 205 may include a vertical stack of channel members in case of MBC transistors or may include a fin structure (i.e., a fin, or a fin element) in case of FinFETs. In the embodiments represented in FIGS. 3A-3B, the semiconductor device 200 includes MBC transistors and each of the fin-shaped active regions 205 may be formed from a portion of the substrate 202 and a vertical semiconductor stack 207 using a combination of lithography and etch steps. In the depicted embodiment, the stack 207 includes a number of channel layers 208 interleaved by a number of sacrificial layers 206. Each channel layer 208 may include a semiconductor material such as, silicon, germanium, silicon carbon, silicon germanium, or other suitable semiconductor materials, or combinations thereof, while each sacrificial layer 206 has a composition different from that of the channel layer 208. The channel layers 208 and the sacrificial layers 206 may be epitaxially deposited on the substrate 202 using molecular beam epitaxy (MBE), vapor-phase epitaxy (VPE), ultra-high vacuum CVD (UHV-CVD), and/or other suitable epitaxial growth processes. In some other embodiments, each of the fin-shaped active regions 205 may be a fin structure and the semiconductor device 200 may include FinFETs. The fin-shaped active regions 205 may include silicon (Si) or another elementary semiconductor, such as germanium (Ge); a compound semiconductor such as silicon carbide (SiC), gallium arsenide (GaAs), gallium phosphide (GaP), indium phosphide (InP), indium arsenide (InAs), and/or indium antimonide (InSb); an alloy semiconductor such as silicon germanium (SiGe), gallium arsenic phosphorus (GaAsP), aluminum indium arsenic (AlInAs), aluminum gallium arsenic (AlGaAs), indium gallium arsenic (InGaAs), gallium indium phosphorus (GaInP), and/or gallium indium arsenic phosphorus (GaInAsP); or combinations thereof.

The workpiece 200 also includes a hard mask layer 210 formed on the fin-shaped active region 205 to protect the fin-shaped active region 205 during a subsequent etching process. The hard mask layer 210 may include any suitable material, such as a semiconductor material or a nitride-based material, so long as its composition is distinct from that of the to-be-formed dummy fins 216a-216b and the channel layer 208 disposed thereunder to allow selective removal by an etching process. In this depicted example, the channel layer 208 is formed of silicon (Si), the sacrificial layer 206 is formed of silicon germanium (SiGe), and the hard mask layer 210 is formed of silicon germanium (SiGe).

Still referring to FIG. 3A, the first and second fin-shaped active regions 205a-205b are separated by a first isolation structure 204a, and the second and third fin-shaped active regions 205b-205c are separated by a second isolation structure 204b. The isolation structures 204a-204b may include silicon oxide, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. The isolation structures 204a-204b may include shallow trench isolation (STI) features. In one embodiment, the isolation structures 204a-204b are formed by filling trenches that separate the fin-shaped active regions 205 with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and selectively etched back to form the isolation structures 204a-204b. The isolation structures 204a-204b may include a single-layer structure or a multi-layer structure and may include silicon oxide or other suitable material. After the etching back, a trench 212 is defined by the top surface of the isolation structure 204a/204b and the sidewall surfaces of two adjacent fin-shaped active regions 205.

Referring to FIGS. 1, 4A, 4B, 5A and 5B, method 100 includes a block 104 where cladding layers 214' are formed to extend along sidewall surfaces of each fin-shaped active region 205. The formation of the cladding layers 214' (shown in FIG. 5A) may include conformally depositing a material layer 214 (shown in FIG. 4A) over the workpiece 200 or epitaxially growing a material layer 214 by a suitable method, such that the material layer 214 is also formed over top surfaces of the isolation structures 204a-204b and hard mask layer 210 and sidewall surfaces of the fin-shaped active regions 205. In some embodiments, the material layer 214 may have a composition that is different from that of the sacrificial layer 206 such that the cladding layers 214' may be selectively removed by a subsequent etching process without substantially etching the sacrificial layer 206. In an embodiment, the material layer 214 is formed of aluminum oxide ($Al_2O_3$). In some other embodiments, the material layer 214 may be formed of silicon germanium (SiGe), and a germanium content of the material layer 214 is different than a germanium content of the sacrificial layers 206 in the vertical stack 207 to facilitate the selective removal of the cladding layers 214'. For example, the germanium content of the material layer 214 may be between about 30% and about 50%, and the germanium content of the sacrificial layers 206 may be 15% and about 20%.

Subsequently, referring to FIGS. 5A and 5B, an etching process is performed to selectively remove portions of the material layer 214, thereby forming the cladding layers 214' extending along sidewalls of the fin-shaped active regions 205. The etching process may include a dry etching process, such as an RIE process. In the present embodiment, the cladding layers 214' partially fill the trench 212. A width of the unfilled portion of the trench 212 along the Y direction is now marked as W2.

Referring to FIGS. 1, 6A, and 6B, method 100 includes a block 106 where a dielectric layer 216 is formed over the workpiece 200 to substantially fill the trenches 212. The dielectric layer 216 is deposited over the workpiece 200 using CVD, SACVD, FCVD, PVD, ALD, spin-on coating, and/or other suitable process. The dielectric layer 216 may be formed of materials that are robust or rigid enough to resist process losses (e.g., etch loss while recessing source/drain regions for forming source/drain trenches 230) and further have a high selectivity in a subsequent etching process (e.g., etching processes employed in removing dummy gate structure 226 and sacrificial layers 206). That is, a composition of the dielectric layer 216 is distinct from the compositions of the hard mask layer 210, the cladding layer 214', the channel layers 208, the sacrificial layers 206 and the dummy gate structures to withstand some selective etching processes and allow selective removal by another selective etching process. The dielectric layer 216 may include polycrystalline silicon carbide (SiC), amorphous silicon carbide (SiC), silicon oxycarbide (SiOC), silicon carbonitride (SiCN), silicon oxycarbonitride (SiOCN), other suitable silicon carbide-based material, other suitable low-k dielectric material, hafnium oxide (HfO2), aluminum oxide (Al2O3), or other suitable high-k dielectric material. In embodiments where the channel layers 208 are formed of silicon, the sacrificial layers 206 and the hard mask layer 210 are formed of silicon germanium, the cladding layer 214' is formed of aluminum oxide ($Al_2O_3$), the dielectric layer 216 may be formed of a silicon carbide-based material such as silicon oxycarbide (SiOC). In embodiments where the cladding layer 214' is formed of silicon germanium, the dielectric layer 216 may be formed of aluminum oxide ($Al_2O_3$). After the deposition of the dielectric layer 216, a planarization process, such as a chemical mechanical polishing (CMP) process, may be performed to planarize the workpiece 200 to provide a planar top surface. The extent at which the dielectric layer 216 is planarized may be determined by a desired height of the to-be-formed first dummy fin 216a (shown in FIG. 8A and FIG. 9A).

Referring to FIGS. 1, 7A and 7B, method 100 includes a block 108 where a patterned mask layer 218 is formed to cover a portion of the dielectric layer 216 disposed over the first isolation structure 204a while exposing the rest of the dielectric layer 216 (e.g., a portion of the dielectric layer 216 disposed over the second isolation structure 204b). In some embodiments, a mask layer may be deposited over the workpiece 200 using CVD or ALD and then a photoresist layer (not shown) may be deposited over the mask layer using spin-on coating or a suitable process. The photoresist layer may be patterned using photolithography process to form a patterned photoresist layer that can be applied as an etch mask in an etching process to pattern the mask layer to form the patterned mask layer 218. As shown in FIG. 7A, the patterned mask layer 218 covers or protects the portion of the dielectric layer 216 disposed directly over the first isolation structure 204a while the portion of the dielectric layer 216 disposed directly over the second isolation structure 204b is exposed. After forming the patterned mask layer 218, the patterned photoresist layer may be removed. In some embodiments, the patterned mask layer 218 may include silicon oxide, silicon nitride, silicon oxynitride, or other suitable materials. A composition of the patterned mask layer 218 may be different than that of the dielectric layer 216 such that the patterned mask layer 218 may be selectively removed in subsequent processes. The patterned mask layer 218 has a width W3 along the Y direction. In some embodiments, the width W3 may be greater than or equal to the width W2 of the partially filled trench 212, depending on a desired profile of the first dummy fin 216a (the first dummy fin 216a shown in FIG. 8A) and the photolithography resolution.

Referring to FIGS. 1, 8A and 8B, method 100 includes a block 110 where an etching process 220 is performed to selectively recess the dielectric layer 216 to form a first dummy fin 216a disposed directly over the first isolation structure 204a and a second dummy fin 216b disposed directly over the second isolation structure 204b. The first dummy fin 216a and the second dummy fin 216b are configured to isolate adjacent source/drain features that would be formed in and over adjacent fin-shaped active regions 205. In embodiments represented in FIG. 8A, the first dummy fin 216a is further configured to cut a functional gate stack 242 (shown in FIG. 16A) that would be formed over the fin-shaped active regions 205 into two pieces. As shown in FIG. 8A and FIG. 8B, while using the patterned mask layer 218 as an etch mask, the etching process 220 recesses portions the dielectric layer 216 that are not covered by the patterned mask layer 218 without substantially etching the cladding layers 214' and the hard mask layer 210. The extent at which the dielectric layer 216 is recessed may be controlled by duration of the etching process 220 and may be determined by a desired height H2 of the second dummy fin 216b. In embodiments represented in FIG. 8A, the second dummy fin 216b is configured to isolate adjacent source/drain features while not cutting the functional gate stack 242 into two pieces. In some embodiments, the height H2 of the second dummy fin 216b may be substantially equal to the height H1 of the fin-shaped active region 205 such that the gate stack 242 (shown in FIG. 16A) may not be cut into two pieces. For example, a height difference ΔH1 (shown in FIG. 10A) between the height H1 and the height H2 may be between about −5 nm and about 5 nm. The etching process 220 may include one or more dry etching processes and/or one or more wet etching processes. The patterned mask layer 218 may be selectively removed after the formation of the first dummy fin 216a and the second dummy fin 216b.

As depicted herein, after the performing of the etching process 220, a height of the first dummy fin 216a is different than the height H2 of the second dummy fin 216b. More specifically, due to the presence of the patterned mask layer 218 during the etching process 220, the height of the first dummy fin 216a is greater than the height H2 of the second dummy fin 216b. That is, the first dummy fin 216a not only includes a lower portion filling the trench 212, but also includes an upper portion protruding from the trench 212. The upper portion that protrudes from the trench 212 may be used to cut a functional gate stack 242 into two electrically and physically isolated pieces. A width W2 of the lower portion of the first dummy fin 216a may be greater than, equal to, or smaller than the width W3 of the upper portion of the first dummy fin 216a, depending the width W3 of the patterned mask layer 218. As shown in FIG. 8A, each of the second dummy fin 216b and the lower portion of the first dummy fin 216a is separated from the fin-shaped active regions 205 by the cladding layers 214'.

Figures 9A, 9B:
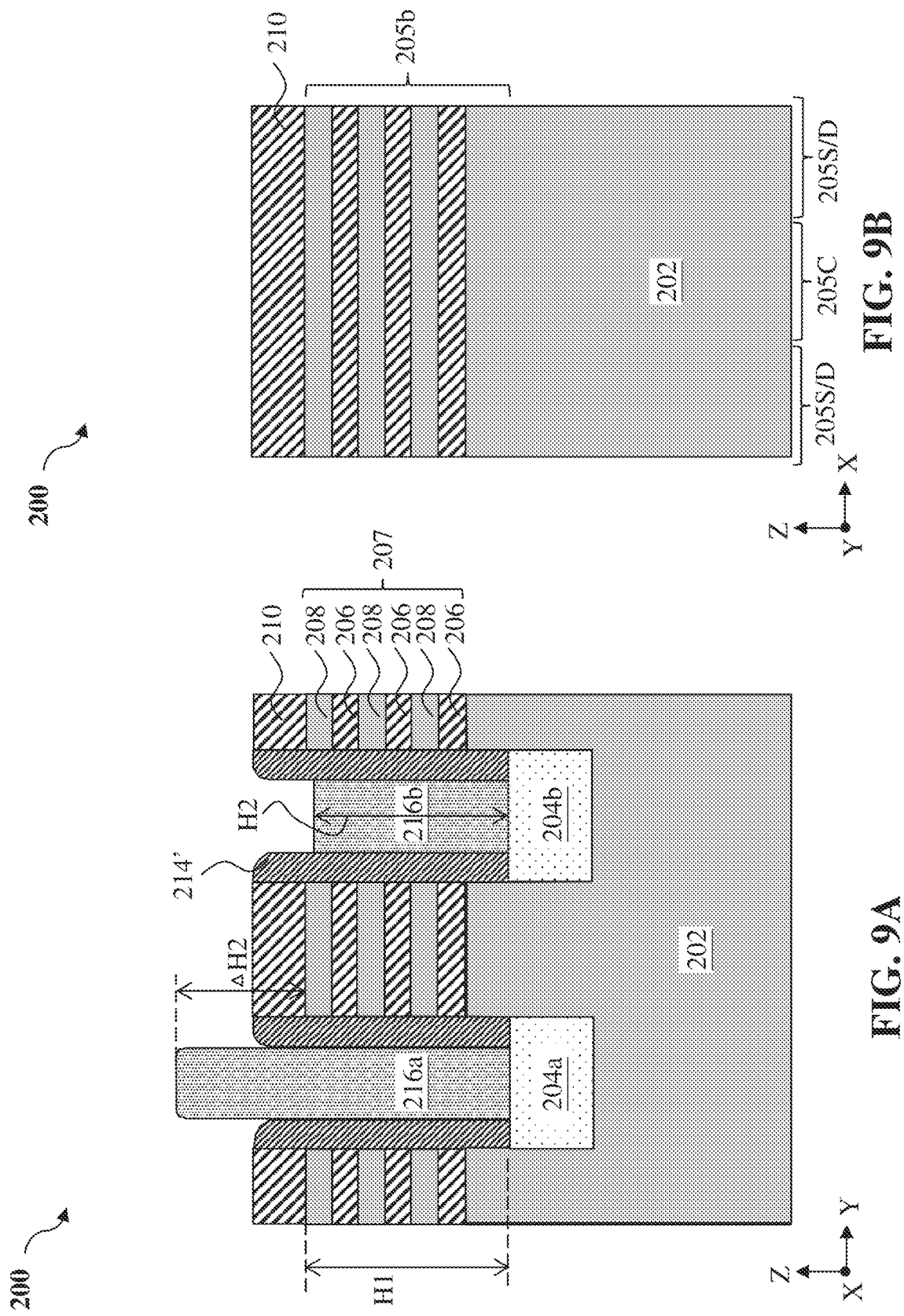

Subsequently, referring to FIGS. 9A and 9B, another etching process may be optionally performed to trim the upper portion of the first dummy fin 216a to further reduce a parasitic capacitance of the semiconductor device 200. In embodiments represented in FIG. 9A, after trimming, the first dummy fin 216a has a substantially uniform width W2 bottom to top. The width W2 may be between about 15 nm and about 25 nm. In some other implementations, after trimming, the width W3 of the upper portion of the first dummy fin 216a may be smaller than the width W2 of the lower portion of the first dummy fin 216a. In some embodiments, a height difference ΔH2 between the height of the first dummy fin 216a and the height H1 of the fin-shaped active region 205 may be further controlled by the duration of the trimming process such that the first dummy fin 216a is able to cut the to-be-formed gate stack 242 (shown in FIG. 16A). In an embodiment, the height difference ΔH2 is between about 20 nm and about 30 nm.

Figures 10A, 10B:
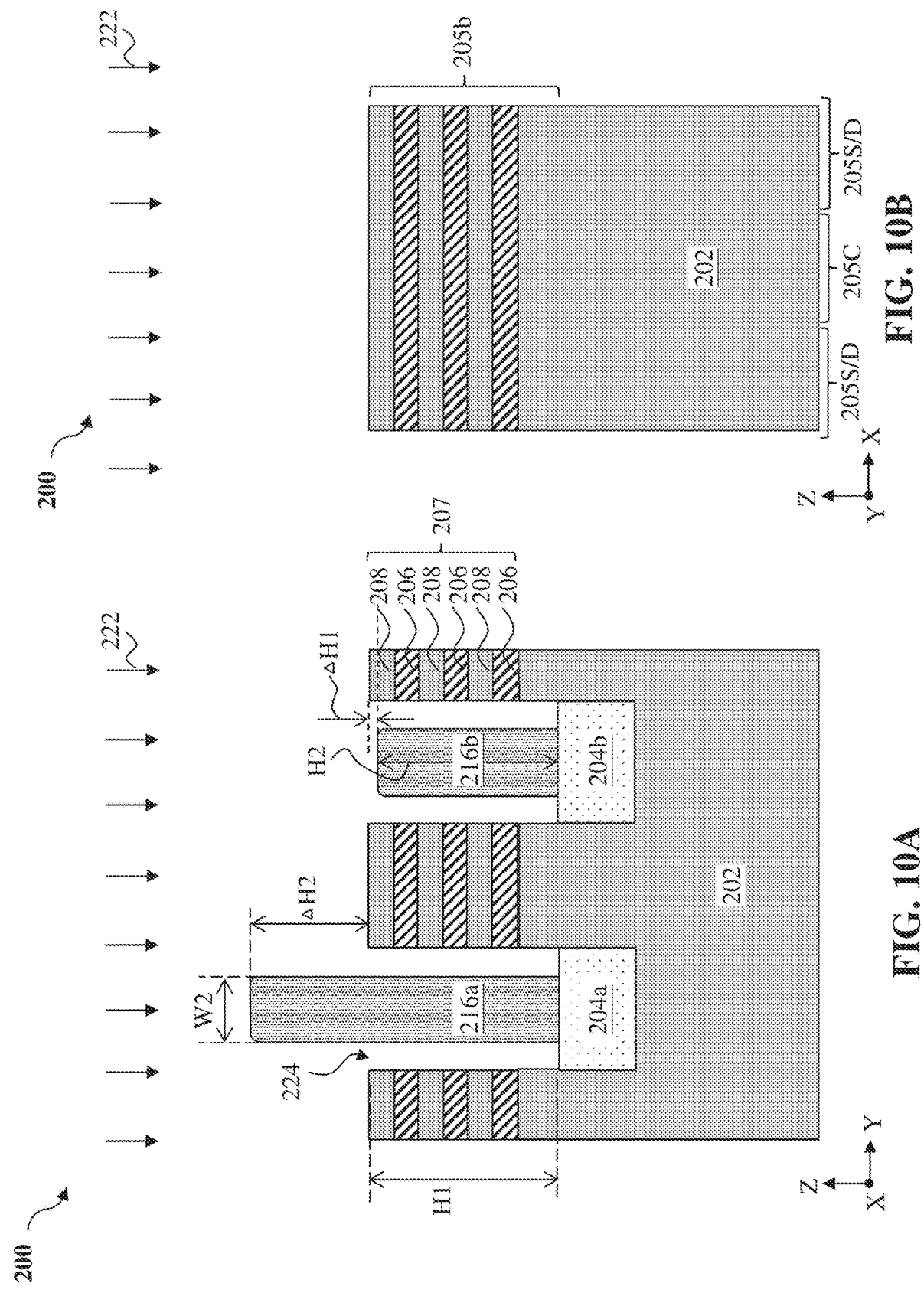

Referring to FIGS. 1, 10A, 10B, 11A, and 11B, method 100 includes a block 112 where a dummy gate structure 226 is formed over the channel regions 205C of the fin-shaped active regions 205. After forming the first dummy fin 216a and the second dummy fin 216b, as shown in FIG. 10A, an etching process 222 is performed to selectively remove the hard mask layer 210 and the cladding layers 214' without substantially etching the fin-shaped active regions 205 and the first and second dummy fins 216a-216b. The etching process 222 may include one or more dry etching processes, one or more wet etching processes, and/or combinations thereof. In embodiments where the hard mask layer 210 is formed of SiGe and the cladding layers 214' are formed of Al2O3, the performing of the etching process 222 may include performing a first etching process to selectively remove the hard mask layer 210 and performing a second etching process to selectively remove the cladding layers 214' after the selective removal of the hard mask layer 210. The removal of the cladding layers 214' leads to formation of trenches 224 between the dummy fin 216a/216b and the fin-shaped active region 205.

Figures 11A, 11B:
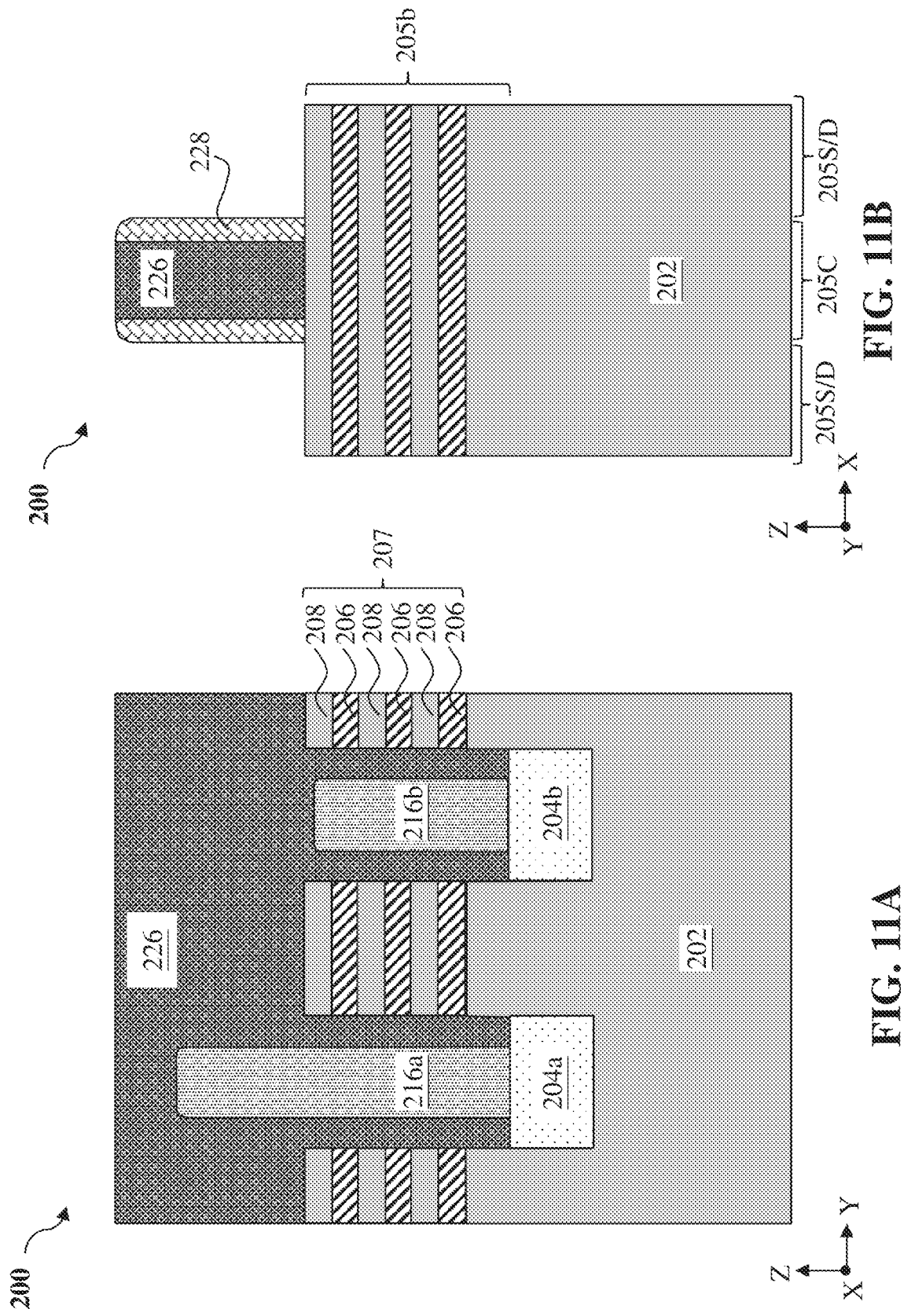

As shown in FIGS. 11A-11B, the dummy gate structure 226 is formed over channel regions 205C of the fin-shaped active regions 205. In this embodiment, a gate replacement process (or gate-last process) is adopted where the dummy gate structure 226 serves as a placeholder for a functional gate stack 242. Other processes and configurations are possible. While not explicitly shown, the dummy gate structure 226 may include a dummy dielectric layer, a dummy electrode disposed over the dummy dielectric layer, and a hard mask layer over the dummy electrode. The regions of the fin-shaped active regions 205 underlying the dummy gate structure 226 may be referred to as channel regions 205C. Each of the channel regions 205C in a fin-shaped active region 205 is sandwiched between two source/drain regions 205S/D. In some embodiments, the dummy dielectric layer may include silicon oxide and the dummy electrode may include polycrystalline silicon (polysilicon). After the dummy gate structure 226 is formed, a gate spacer 228 may be formed along sidewalls of the dummy gate structure 226. The gate spacer 228 may include two or more gate spacer layers. Dielectric materials for the gate spacer 228 may be selected to allow selective removal of the dummy gate structure 226 without substantially damaging the gate spacer 228. Suitable dielectric materials of the gate spacer 228 may include silicon nitride, silicon oxycarbonitride, silicon carbonitride, silicon oxide, silicon oxycarbide, silicon carbide, silicon oxynitride, and/or combinations thereof. In embodiments represented in FIG. 11A, the dummy gate structure 226 also fills the trenches 224. That is, the first and second dummy fins 216a-216b are separated from the fin-shaped active region 205 by the dummy gate structure 226.

Figures 12A, 12B:
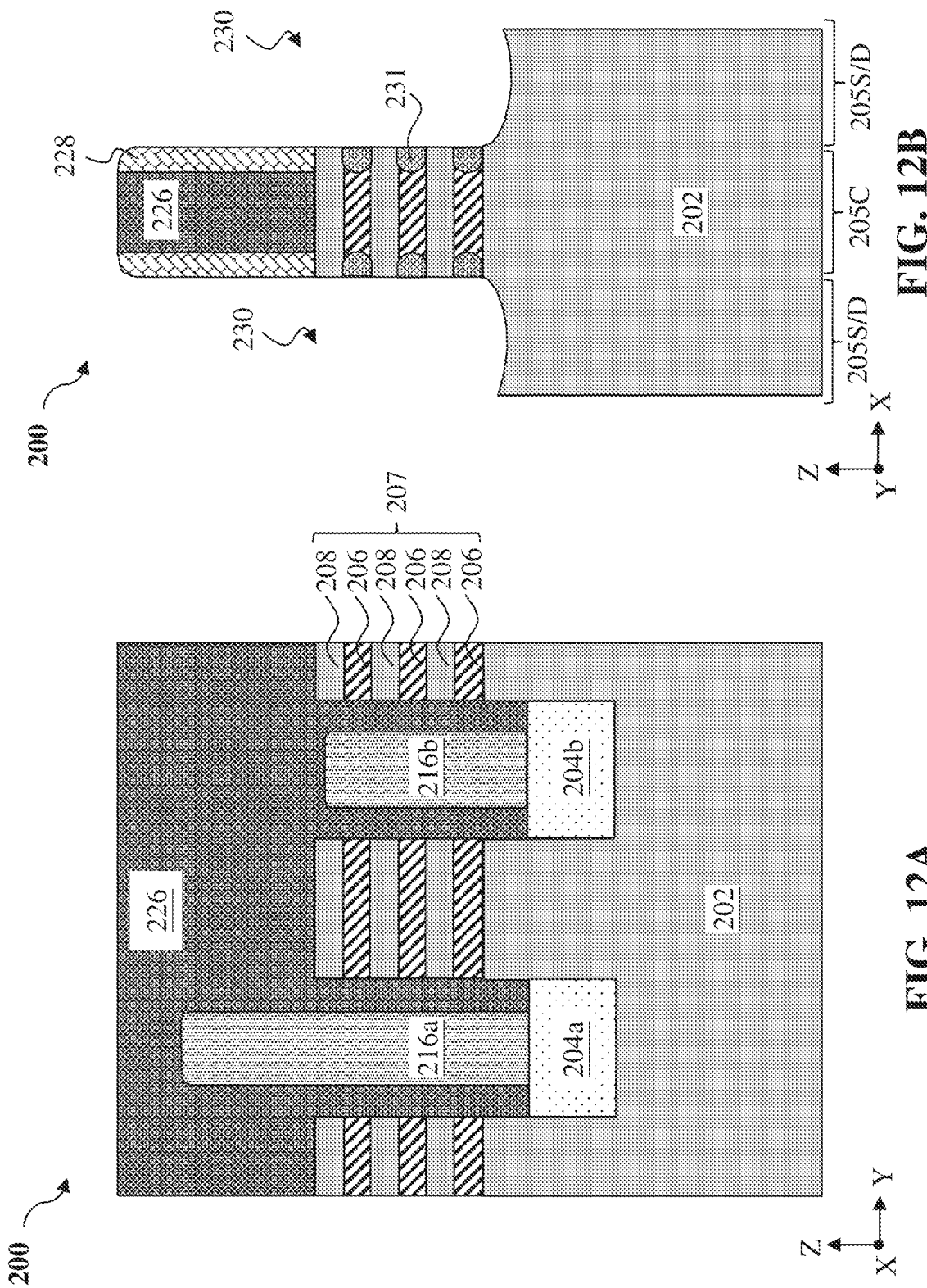
Figure 12C:
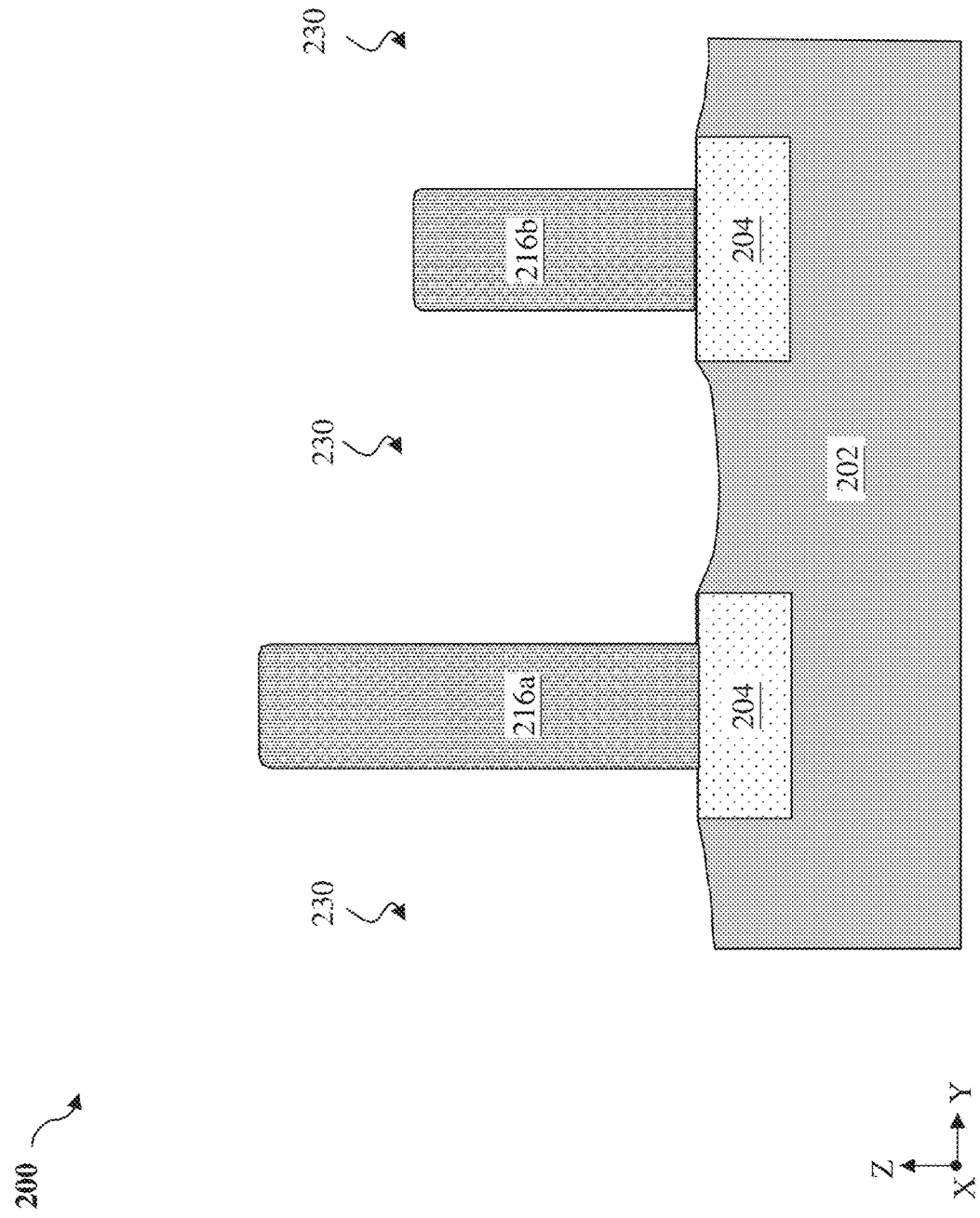
FIGS. 12C and 13C illustrate fragmentary cross-sectional views of the exemplary workpiece taken along line C-C' as shown in FIG. 2 during various fabrication stages in the method of FIG. 1, according to one or more aspects of the present disclosure.

Referring to FIGS. 1, 12A, 12B, and 12C, method 100 includes a block 114 where source/drain regions 205S/D of the fin-shaped active regions 205 are selectively recessed to form source/drain trenches 230. With the dummy gate structure 226 and the gate spacer 228 serving as an etch mask, the source/drain regions 205S/D of the fin-shaped active regions 205 are etched to form source/drain trenches 230 without substantially etching the first and second dummy fins 216a-216b. FIG. 12C depicts a cross-sectional view of the workpiece 200 taken along line C-C' as shown in FIG. 2. Source/drain trenches 230 may not only extend through the stack 207, but also extend through a portion of the substrate 202.

Still referring to FIGS. 1, 12A, and 12B, method 100 includes a block 116 where inner spacer features 231 are formed. After forming source/drain trenches 230, the sacrificial layers 206 exposed in the source/drain trenches 230 are selectively and partially recessed to form inner spacer recesses (filled by inner spacer features 231), while the exposed channel layers 208 are substantially unetched. In some embodiments, this selective recess may include a selective isotropic etching process (e.g., a selective dry etching process or a selective wet etching process), and the extent at which the sacrificial layers 206 is recessed is controlled by duration of the etching process. After the formation of the inner spacer recesses, an inner spacer material layer is then conformally deposited using CVD or ALD over the workpiece 200, including over and into the inner spacer recesses. The inner spacer material may include silicon nitride, silicon oxycarbonitride, silicon carbonitride, silicon oxide, silicon oxycarbide, silicon carbide, or silicon oxynitride. The inner spacer material layer is then etched back to form inner spacer features 231, as illustrated in FIG. 12B.

Figure 13C:
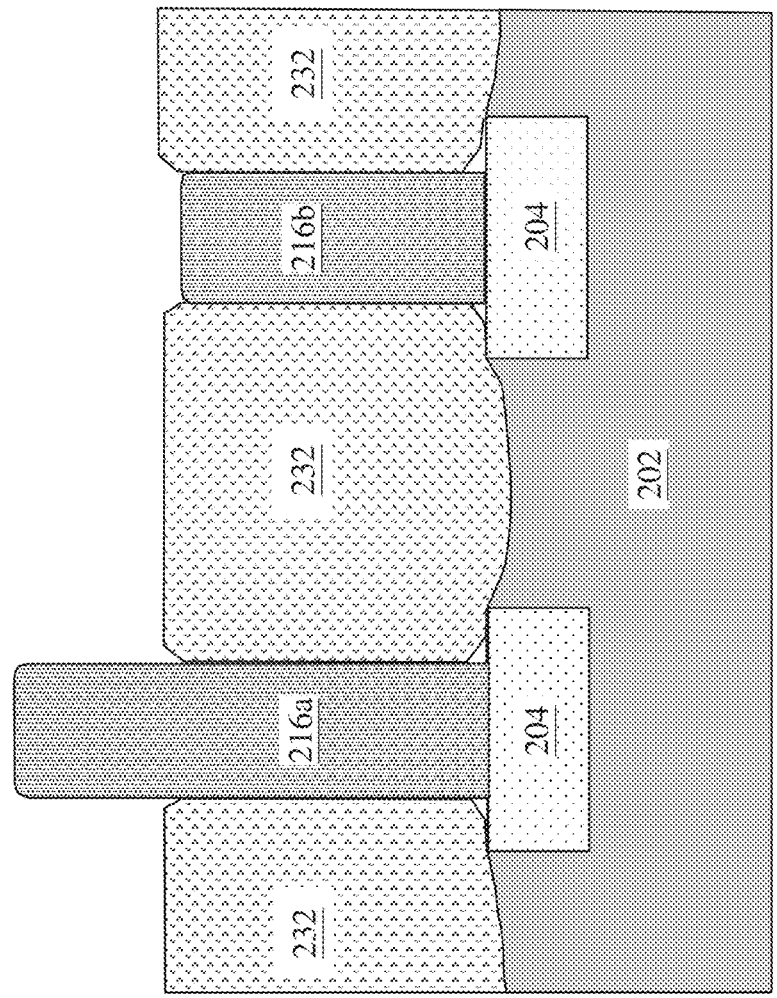

Referring to FIGS. 1, 13A, and 13B, method 100 includes a block 118 where source/drain features 232 are epitaxially formed in the source/drain trenches 230 by using an epitaxial process, such as VPE, UHV-CVD, MBE, and/or other suitable processes. The source/drain features 232 are therefore coupled to the channel layers 208 in the channel regions 205C of the fin-shaped active regions 205. Depending on the conductivity type of the to-be-formed transistor, the source/drain features 232 may be n-type source/drain features or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process. As exemplary shown in FIG. 13C, two adjacent source/drain features 232 are separated by the first dummy fin 216a or the second dummy fin 216b. A top surface of the first dummy fin 216a is above a top surface of the source/drain feature 232.

Figures 14A, 14B:
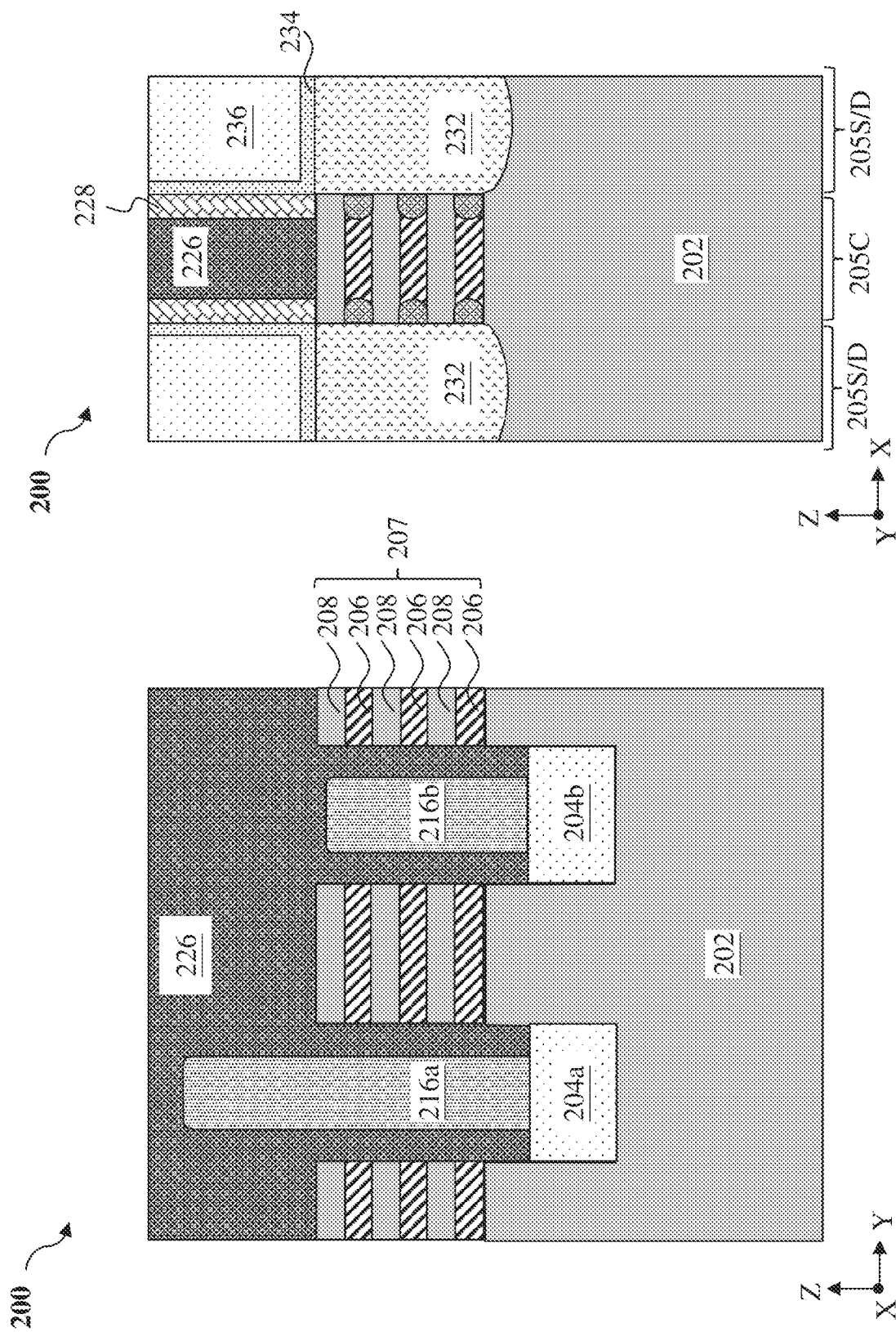

Referring to FIGS. 1, 14A, 14B, 15A, 15B, 16A, 16B, and 17, method 100 includes a block 120 where the dummy gate structure 226 is selectively removed and a functional gate stack 242 is formed. As shown in FIG. 14B, a contact etch stop layer (CESL) 234 and an interlayer dielectric (ILD) layer 236 are deposited over the workpiece 200. The CESL 234 may include silicon nitride, silicon oxynitride, and/or other suitable materials and may be formed by ALD, plasma-enhanced chemical vapor deposition (PECVD) process and/or other suitable deposition or oxidation processes. As shown in FIG. 14B, the CESL 234 may be deposited on top surfaces of the source/drain features 232 and sidewalls of the gate spacer 228. The ILD layer 236 is deposited by a PECVD process or other suitable deposition technique over the workpiece 200 after the deposition of the CESL 234. The ILD layer 236 may include materials similar to that of the isolation structures 204a-204b. A planarization process may be then performed to remove excess materials such as removing the hard mask layer in the dummy gate structure 226 and portions of the CESL 234 and the ILD layer 236 over the hard mask layer.

Figure 15B:
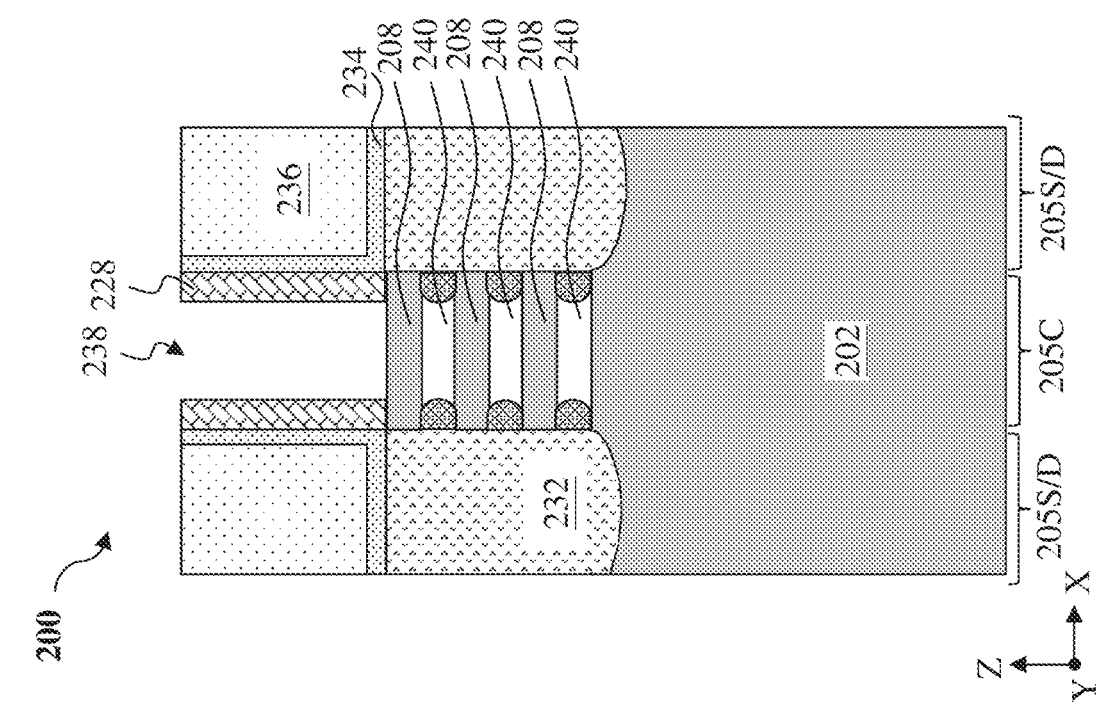
Figure 15A:
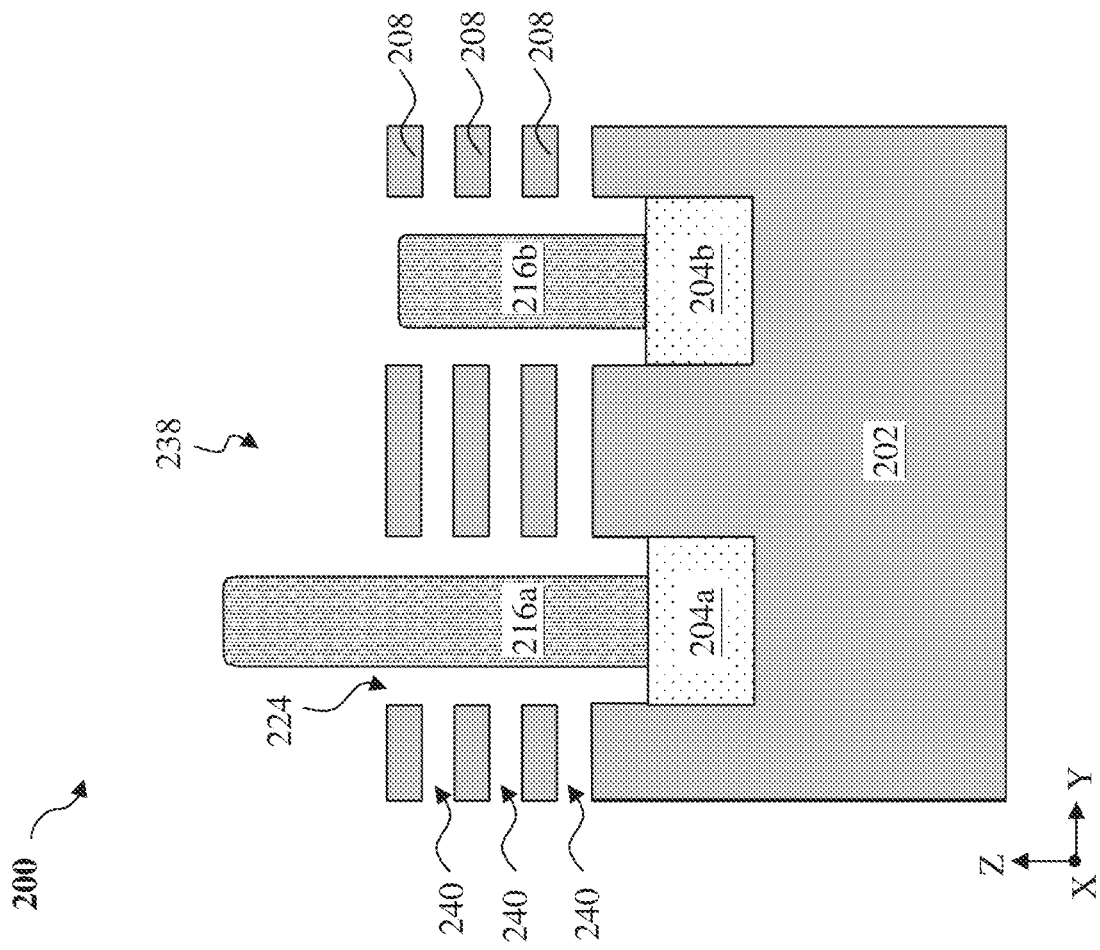

Subsequently, referring to FIGS. 15A-15B, the dummy gate structure 226 is selectively removed. The removal of the dummy gate structure 226 forms a trench 238 over the channel region 205C and releases the trench 224. The etching process may include any suitable process, such as a dry etching process, a wet etching process, or combinations thereof, and is configured to selectively remove the dummy gate structure 226 without substantially etching the first and second dummy fins 216a-216b, the channel layers 208, the gate spacer 228, the CESL 234, and the ILD layer 236. After the selective removal of the dummy gate structure 226, the sacrificial layers 206 are selectively removed to form a number of openings 240 interleaved with the channel layers 208 without substantially removing the channel layers 208 and the first and second dummy fins 216a-216b. In one example, a wet etching process employing an oxidant such as ammonium hydroxide ($NH_4OH$), ozone ($O_3$), nitric acid ($HNO_3$), hydrogen peroxide ($H_2O_2$), other suitable oxidants, and a fluorine-based etchant such as hydrofluoric acid (HF), ammonium fluoride ($NH_4F$), other suitable etchants, or combinations thereof may be performed to selectively remove the sacrificial layers 206 to release the channel layers 208 as channel members 208.

Referring to FIGS. 1, 16A, 16B, and 17, a metal gate stack 242 is formed over the workpiece 200 to fill the trench 238, the trench 224, and the openings 240 to wrap around each of the channel members 208. The metal gate stack 242 may include an interfacial layer (not separately labeled), a gate dielectric layer (not separately labeled) over the interfacial layer, and a gate electrode layer (not separately labeled) over the gate dielectric layer. In some embodiments, the interfacial layer may include silicon oxide formed by thermal oxidization. The gate dielectric layer is then deposited over the interfacial layer using ALD, CVD, and/or other suitable methods. The gate dielectric layer may include high-k dielectric materials. As used herein, high-k dielectric materials include dielectric materials having a high dielectric constant, for example, greater than that of thermal silicon oxide (~3.9). In one embodiment, the gate dielectric layer may include hafnium oxide. Alternatively, the gate dielectric layer may include other high-k dielectrics, such as titanium oxide ($TiO_2$), hafnium zirconium oxide (HfZrO), tantalum oxide ($Ta_2O_5$), hafnium silicon oxide ($HfSiO_4$), zirconium oxide, zirconium silicon oxide ($ZrSiO_2$), lanthanum oxide ($La_2O_3$), aluminum oxide ($Al_2O_3$), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable material. A gate electrode layer is deposited over the gate dielectric layer. The gate electrode layer may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. In various embodiments, a planarization process, such as a CMP process, may be performed to remove excess portions of those materials to provide a substantially planar top surface of the gate stack 242. The planarization process may stop when it reaches or before reaching the top surface of the first dummy fin 216a.

Figures 16A, 16B:
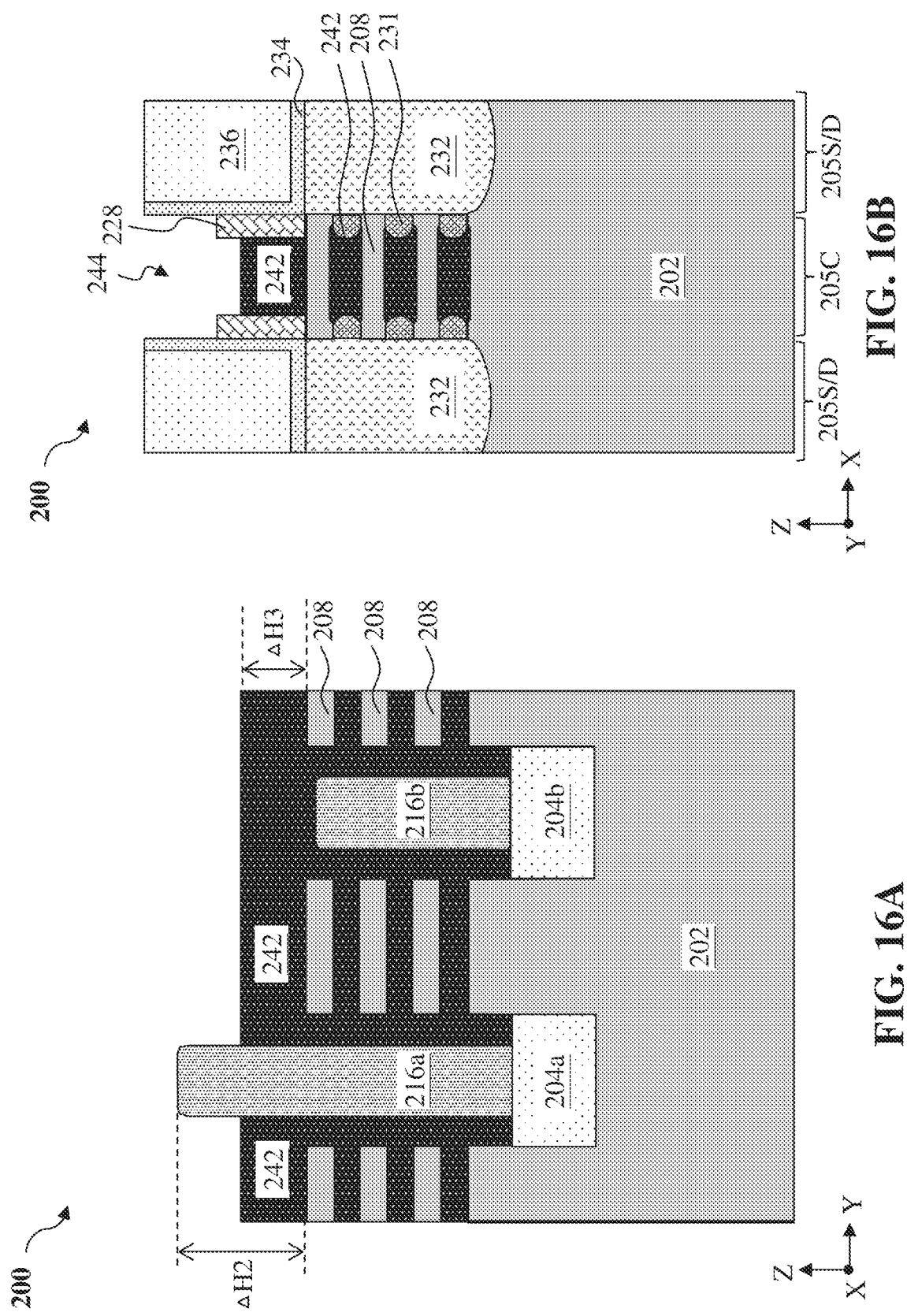

Still referring to FIGS. 1, 16A, 16B, and 17, method 100 includes a block 122 where an etching process is performed to selectively recess the metal gate stack 242 until a portion of the first dummy fin 216a protrudes from a top surface of the recessed gate stack 242. The etching process stops before the second dummy fin 216b is exposed. The etching process may include any suitable process, such as a dry etching process, a wet etching process, an RIE, or combinations thereof, configured to selectively remove the metal gate stack 242 without substantially etching the first and second dummy fins 216a-216b, the gate spacer 228, the CESL 234, and the ILD layer 236. Another etching process may be followed to selectively recess the gate spacer 228 without substantially etching the first and second dummy fins 216a-216b, the metal gate stack 242, the CESL 234, and the ILD layer 236. As shown in FIG. 16B, the selective recess of the metal gate stack 242 and selective recess of the gate spacer 228 forms a trench 244.

Figure 17:
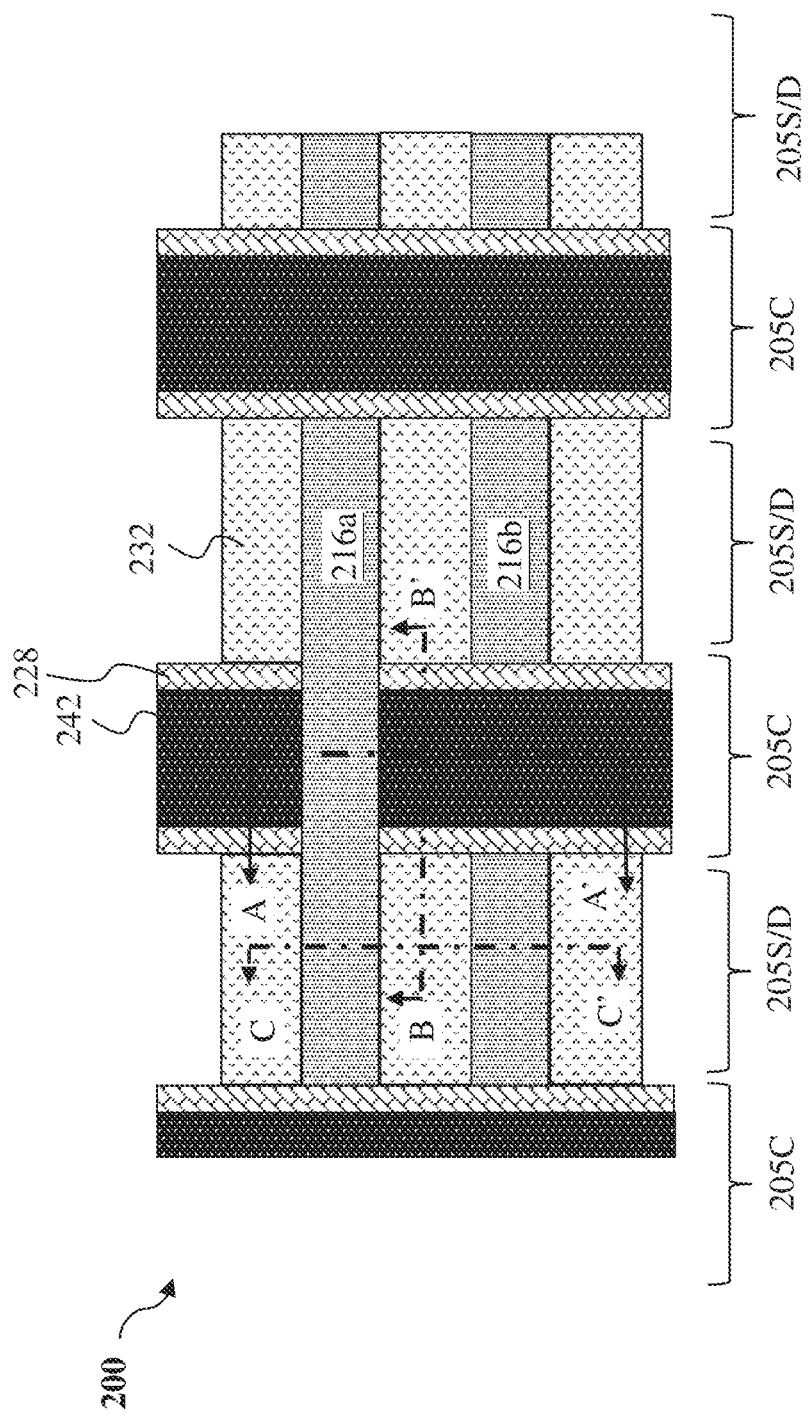
FIG. 17 is a fragmentary planar top view of an exemplary workpiece shown in FIGS. 18A and 18B, according to various aspects of the disclosure.

The resulting height of the recessed gate stack 242 may be controlled by adjusting the duration of the etching process. In the present embodiments, after the selective recess of the metal gate stack 242, a top surface of the recessed gate stack 242 is above the top surface of the topmost channel layer 208 and is below the top surface of the first dummy fin 216a. In an embodiment, a height difference ΔH3 between the top surface of the recessed gate stack 242 and the top surface of the topmost channel layer 208 may be between about 10 nm and about 20 nm. By forming the first dummy fin 216a that protrudes from the top surface of the recessed gate stack 242, the recessed gate stack 242 is cut into two electrically and physically isolated pieces, such that the transistor formed in and over the first fin-shaped active region 205a and the transistor formed in and over the second fin-shaped active region 205b may be separately controlled. By forming the second dummy fin 216b that embedded in the recessed gate stack 242, the recessed gate stack 242 is electrically coupled to the channel layers 208 in the fin-shaped active region 205b and the channel layers 208 in the fin-shaped active region 205b. FIG. 17 depicts a fragmentary top view of the workpiece 200 shown in FIGS. 16A-16B. As shown in FIG. 17, the metal gate stack 242 is cut by the first dummy fin 216a into two electrically isolated portions.

Figure 18:
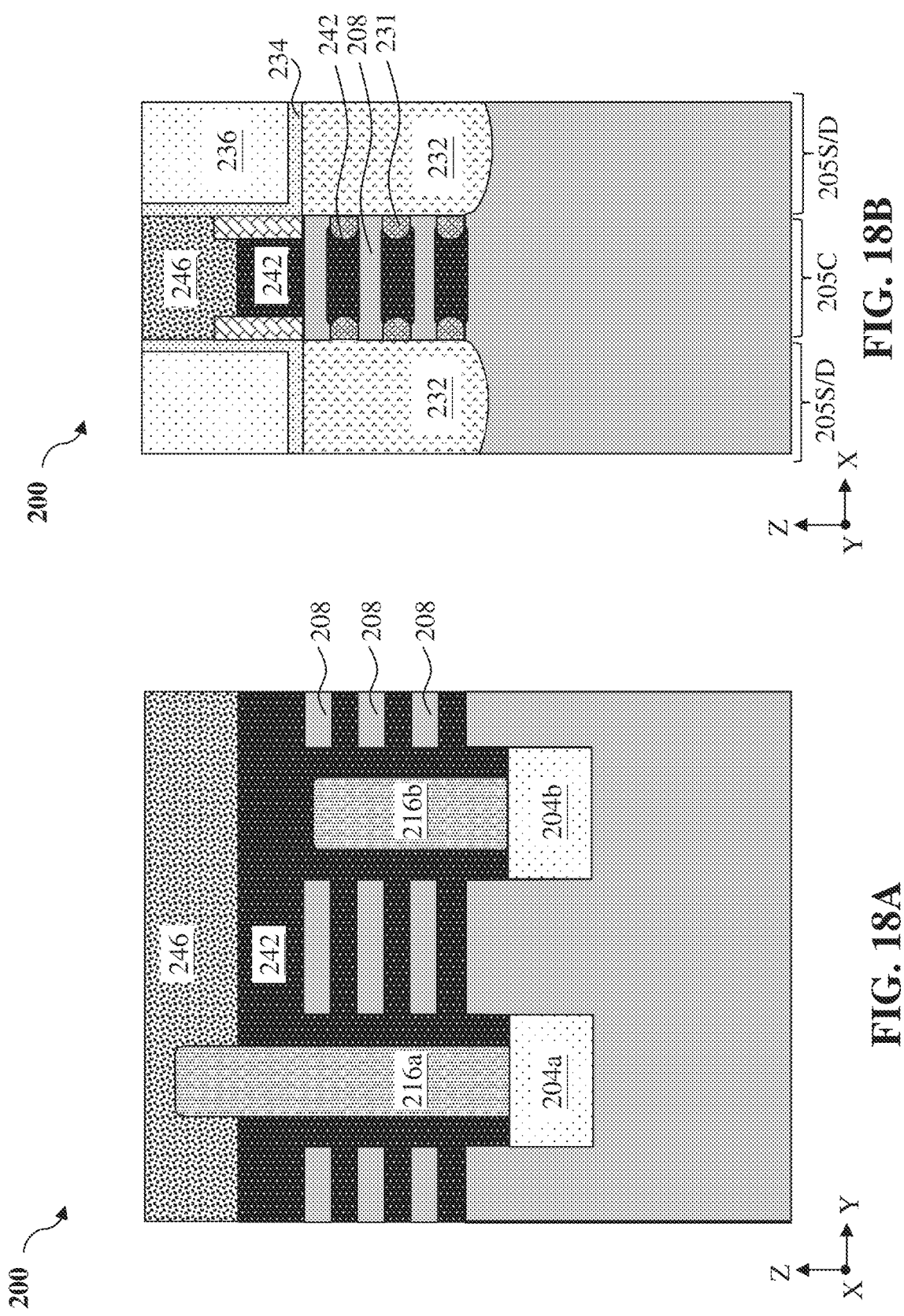
Figure 19:
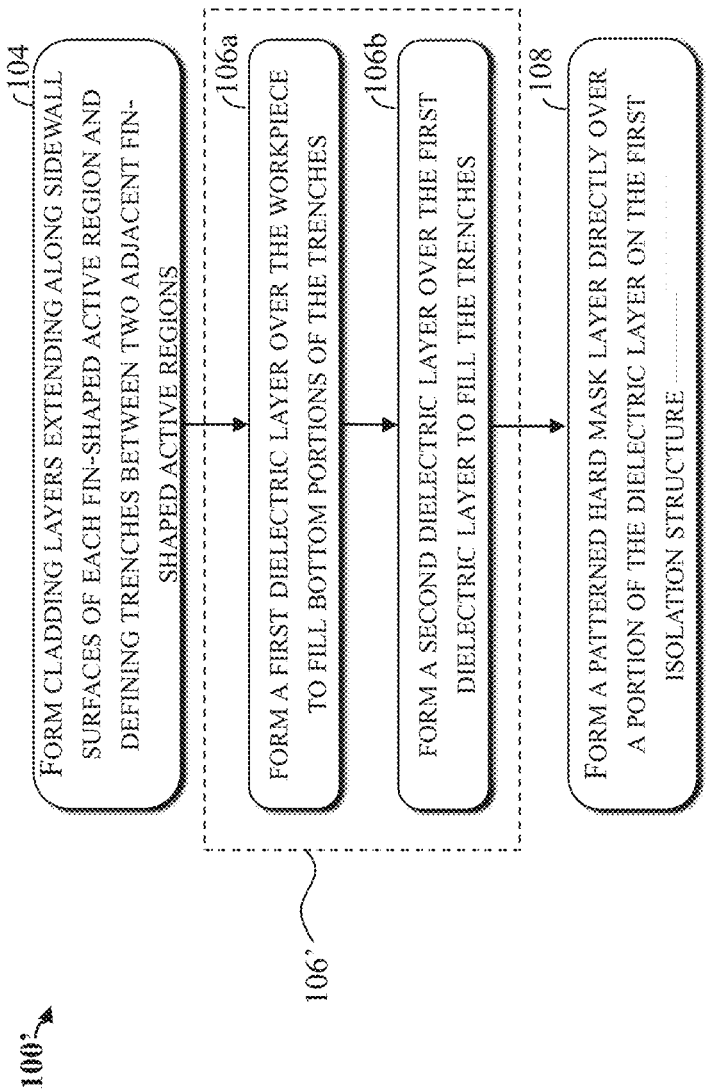
FIG. 19 illustrates a flowchart of a first alternative method for fabricating a semiconductor device, according to various embodiments of the present disclosure.

Referring to FIGS. 1, 18A, and 18B, method 100 includes a block 124 where further processes may be performed to complete the fabrication of the semiconductor device 200. Such further processes may include, for example, as shown in FIGS. 18A-18B, depositing a dielectric layer 246 over the workpiece 200, thereby filling the trench 244. In the present embodiments, the dielectric layer 246 is configured to provide self-alignment capability and etching selectivity during subsequent fabrication processes including, for example, patterning the ILD layer 236 to form source/drain contact openings over the epitaxial source/drain features 232. Accordingly, in the present embodiments, the dielectric layer 246 has a composition different from that of the ILD layer 236. In some embodiments, the dielectric layer 246 may include SiN, SiCN, SiOC, SiON, SiOCN, other suitable materials, or combinations thereof. The dielectric layer 246 may be deposited by any suitable method, such as ALD, CVD, PVD, other suitable methods, or combinations thereof. Subsequently, method 100 removes portions of the dielectric layer 246 formed over the ILD layer 236 in one or more CMP process, thereby planarizing the top surface of the workpiece 200. As illustrated in FIG. 18A, an upper portion of the first dummy fin 216a is embedded in the dielectric layer 246, while a lower portion of the first dummy fin 216a is embedded in the metal gate stack 242.

Such further processes may also include forming a multi-layer interconnect (MLI) structure (not depicted) thereover. The MLI may include various interconnect features, such as vias and conductive lines, disposed in dielectric layers, such as etch stop layers (ESLs) and ILD layers. In some embodiments, the vias are vertical interconnect features configured to interconnect a device-level contact, such as an S/D contact (not depicted) or a gate contact (not depicted), with a conductive line or interconnect different conductive lines, which are horizontal interconnect features. The ESLs and the ILD layers of the MLI may have substantially same compositions as those discussed above with respect to the CESL 234 and the ILD layer 236, respectively. The vias and the conductive lines may each include any suitable conductive material, such as Co, W, Ru, Cu, Al, Ti, Ni, Au, Pt, Pd, a metal silicide, other suitable conductive materials, or combinations thereof, and be formed by a series of patterning and deposition processes. Additionally, each via and conductive line may additionally include a barrier layer that comprises TiN and/or TaN.

In the embodiments described above, the dummy fin (e.g., the first dummy fin 216a, the second dummy fin 216b) is a single-layer structure. The dummy fin may include a multi-layer structure to increase process flexibilities and/or reduce parasitic capacitance. FIGS. 19 and 23 each illustrates an alternative embodiment of forming a multi-layer dummy fin, according to one or more aspects of the present disclosure. The methods 100' and 100" of FIGS. 19 and 23 are in a way similar to the method 100 of FIG. 1 except that the operations in block 106' and 106" are different from operations in block 106 of method 100, respectively.

FIG. 19 illustrates a flowchart of a first alternative method 100' for fabricating a semiconductor device 200', according to various embodiments of the present disclosure. The processes described in blocks 102-104 of FIG. 1 are omitted below for reason of simplicity. FIGS. 20A-22A and 20B-22B illustrate fragmentary cross-sectional views of the exemplary workpiece taken along line A-A' or line B-B' as shown in FIG. 2 during various fabrication stages in the method of FIG. 19, according to one or more aspects of the present disclosure.

Figures 20A, 20B:
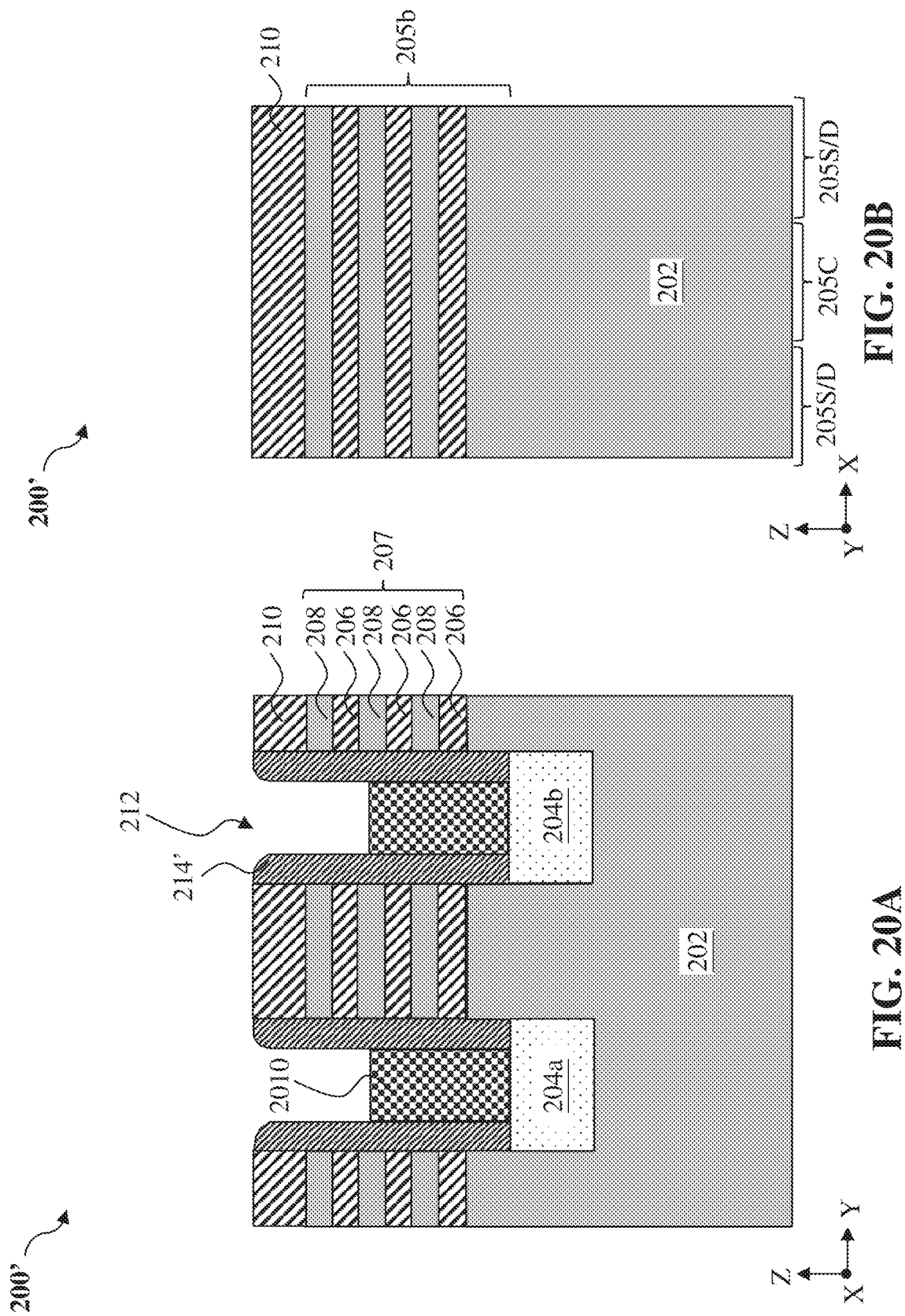

Referring to FIGS. 19, 20A, and 20B, after performing operations in blocks 102-104 of FIG. 1, method 100' moves to block 106'. The block 106' includes a first block 106a where a first dielectric layer 2010 is deposited over the workpiece 200 and fills a bottom portion of the trench 212. Sidewalls of the first dielectric layer 2010 are in direct contact with the cladding layers 214'. In some embodiments, the first dielectric layer 2010 may include SiC, SiCN, SiOC, SiOCN, other suitable materials, or combinations thereof, and may be deposited by any suitable method, such as CVD, PVD, FCVD, spin-on coating, other suitable methods, or combinations thereof. In an embodiment, the first dielectric layer 2010 is formed of SiCN. After the depositing of the first dielectric layer 2010, a planarization (e.g., CMP) may be performed to remove excess portions of the first dielectric layer 2010 such as those over the hard mask layer 210.

Referring to FIGS. 19, 21A, and 21B, block 106' includes a second block 106b where a second dielectric layer 2020 is deposited over the workpiece 200' and substantially fills the rest of the trench 212. The second dielectric layer 2020 is deposited over the workpiece 200 using CVD, SACVD, FCVD, PVD, ALD, spin-on coating, and/or other suitable process. A composition of the second dielectric layer 2020 is different from a composition of the first dielectric layer 2010 and the composition of the second dielectric layer 2020 may be more etch resistant than the first dielectric layer 2010 and/or have a greater dielectric constant than the first dielectric layer 2010. In an embodiment, the first dielectric layer 2010 is formed of SiCN, the second dielectric layer 2020 is formed of SiOC. Subsequently, a planarization process may be performed to remove excessive portions of the second dielectric layer 2020, thereby providing the workpiece 200' a planar top surface.

Figure 22B:
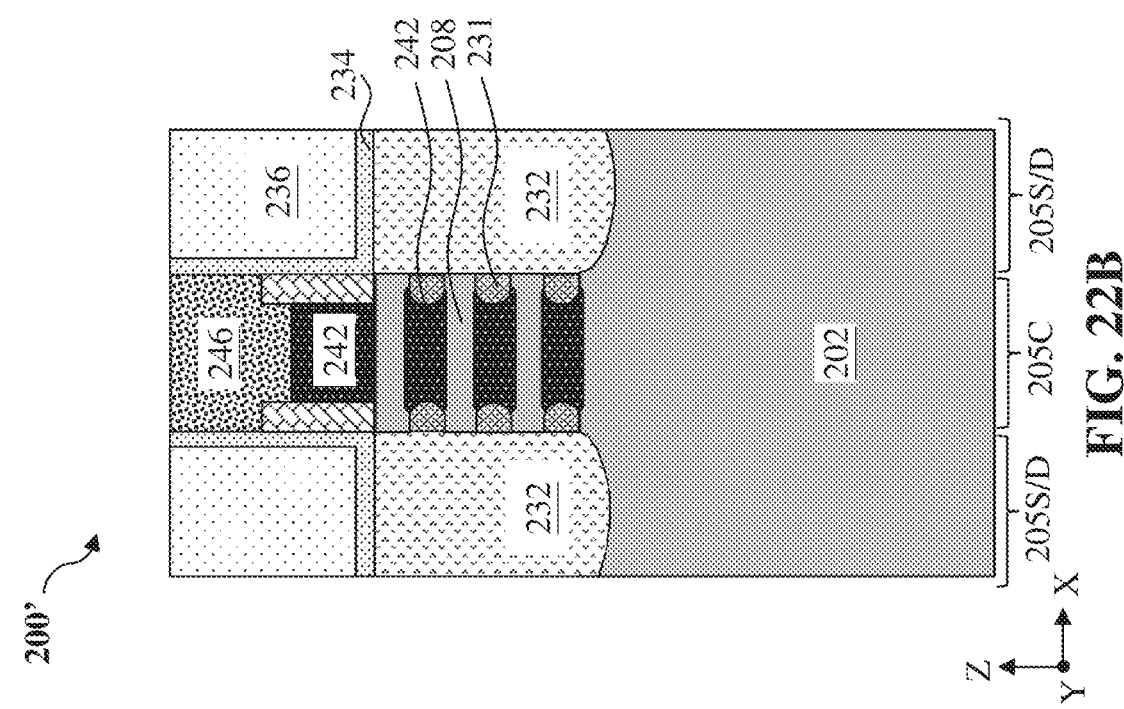
Figure 22A:
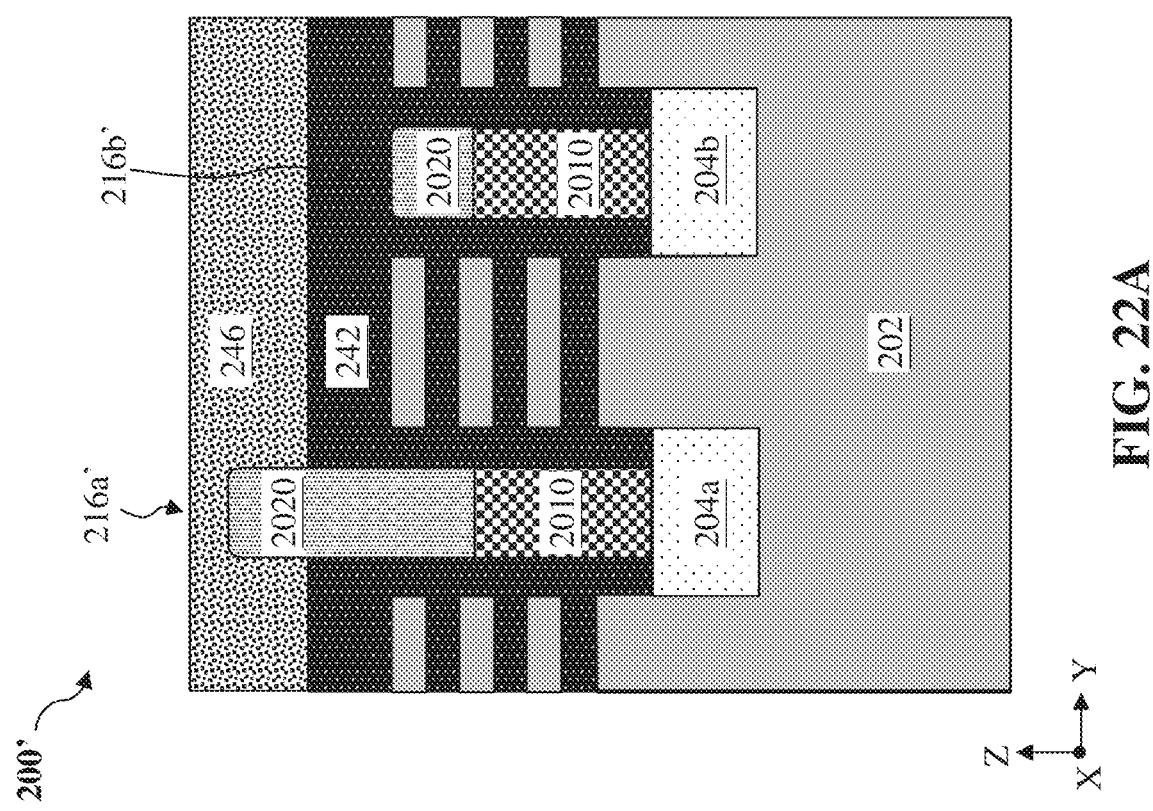
Figure 23:
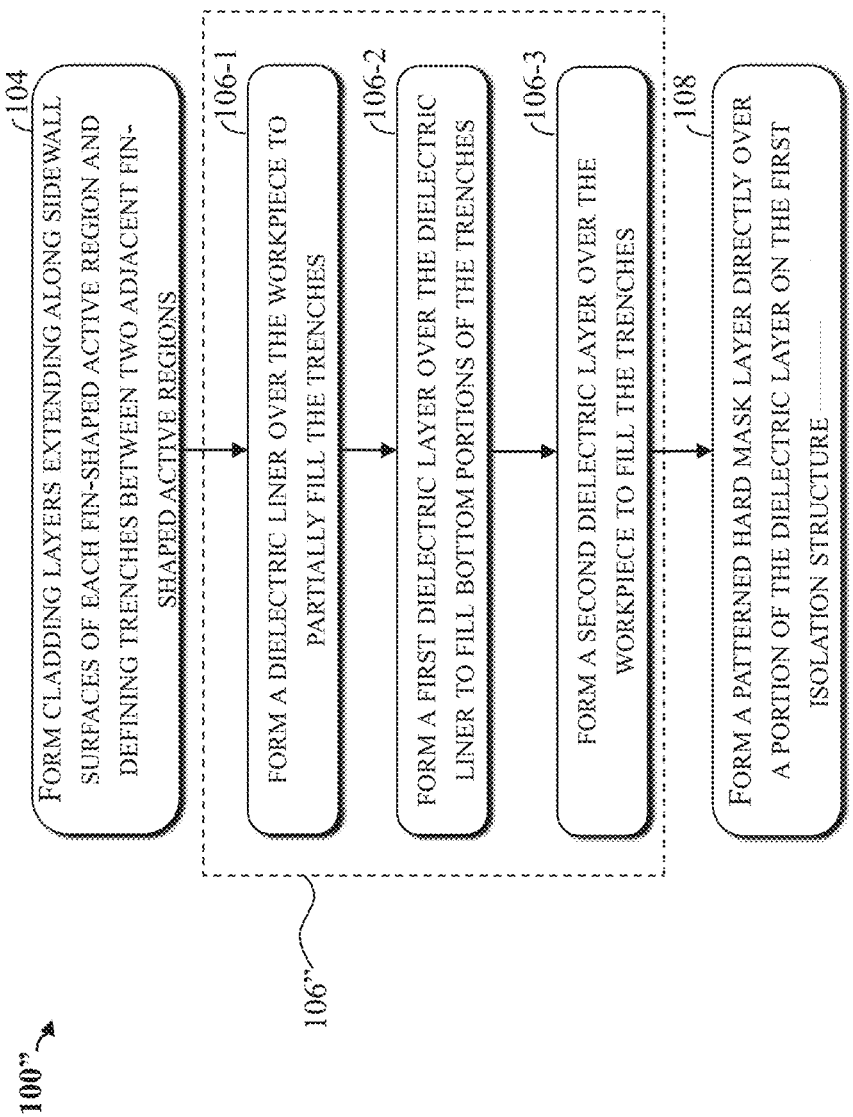
FIG. 23 illustrates a flowchart of a second alternative method for fabricating a semiconductor device, according to various embodiments of the present disclosure.

After performing the operations in block 106', method 100' moves to blocks 108-124 in method 100 of FIG. 1, thereby forming the workpiece 200' shown in FIGS. 22A and 22B. As exemplary shown in FIG. 22A, the workpiece 200' includes a first dummy fin 216a' over the first STI structure 204a and a second dummy fin 216b' over the second STI structure 204b. Both the first dummy fin 216a' and the second dummy fin 216b' include the second dielectric layer 2020 formed on the first dielectric layer 2010. Sidewalls of the first dielectric layer 2010 are in direct contact with the metal gate stacks 242. The second dielectric layer 2020 of the first dummy fin 216a' partially protrudes into the dielectric layer 246, and the second dielectric layer 2020 of the second dummy fin 216b' is embedded in the metal gate stack 242 disposed under the dielectric layer 246. In some other embodiments, a ratio of the height of the first dielectric layer 2010 to a ratio of the height H1 of the fin-shaped active region 205 may be between about ⅔ and about ¾ such that the first dielectric layer 2010 is covered by the second dielectric layer 2020 to resist etch loss while the parasitic capacitance of the workpiece 200 may be advantageously reduced.

FIG. 23 illustrates a flowchart of a second alternative method 100" for fabricating a semiconductor device 200", according to various embodiments of the present disclosure. The processes described in blocks 102-104 of FIG. 1 are omitted below for reason of simplicity. FIGS. 24A-27A and 24B-27B illustrate fragmentary cross-sectional views of the exemplary workpiece taken along line A-A' or line B-B' as shown in FIG. 2 during various fabrication stages in the method of FIG. 23, according to one or more aspects of the present disclosure.

Referring to FIGS. 23, 24A, and 24B, after performing operations in blocks 102-104 of FIG. 1, method 100" moves to block 106". The block 106" includes a first block 106-1 where a dielectric liner 2610 is conformally deposited over the workpiece 200 and partially fills the trench 212 (shown in FIG. 4A). In some embodiments, a composition of the dielectric liner 2610 may be in a way similar to that of the dielectric layer 216 shown in FIG. 6A. The dielectric liner 2610 may be deposited by any suitable method, such as ALD, CVD, other suitable methods, or combinations thereof. In an embodiment, the dielectric liner 2610 is formed of SiOC.

Figures 25A, 25B:
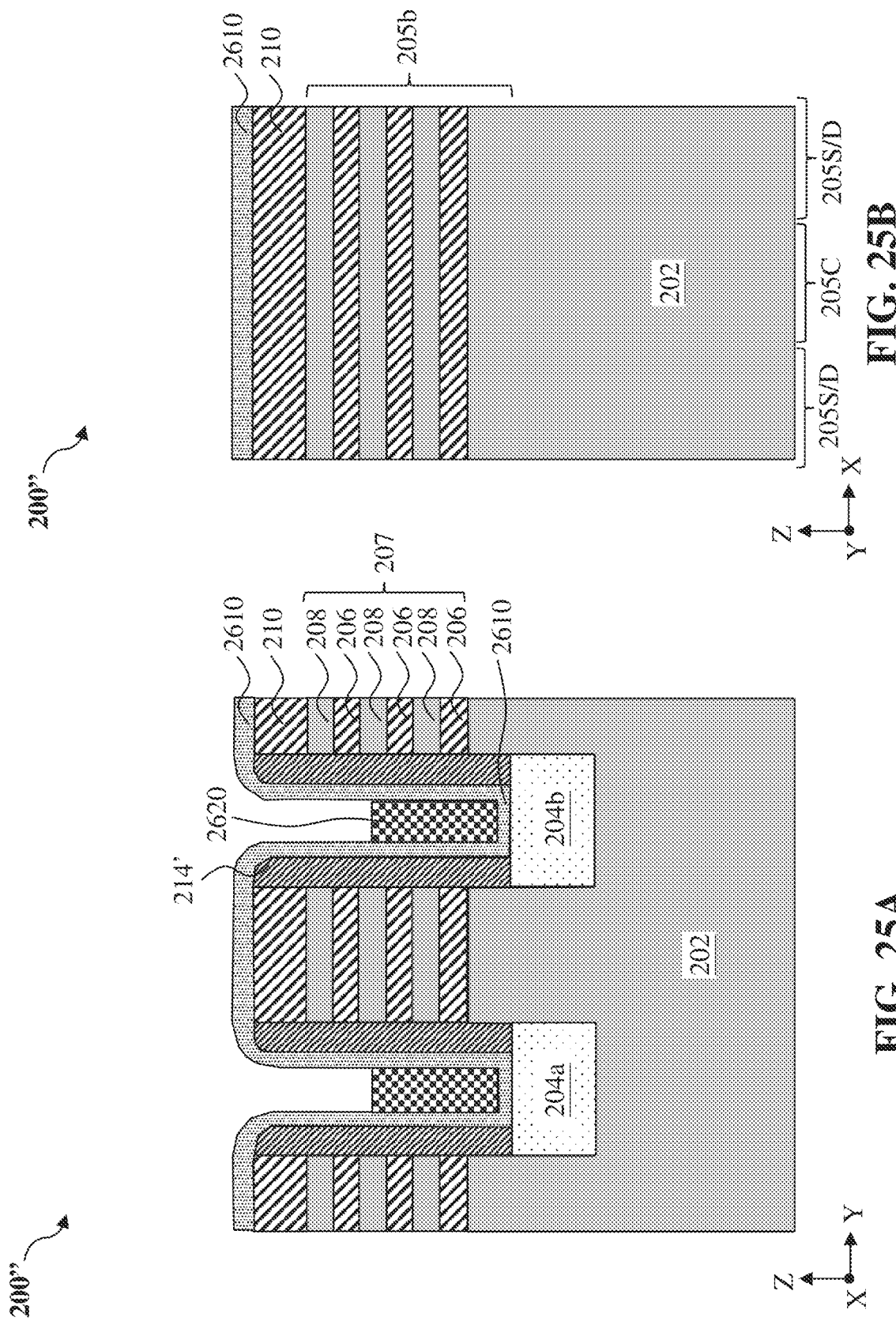

Referring to FIGS. 23, 25A, and 25B, block 106" includes a second block 106-2 wherein a first dielectric layer 2620 is deposited over the workpiece 200" and substantially fills the bottom portion of the trench 212. The first dielectric layer 2620 may be in a way similar to the second dielectric layer 2020 described above with reference to FIG. 20A. In an embodiment, the first dielectric layer 2620 is formed of SiCN. Subsequently, a planarization process (e.g., CMP) may be performed to remove excessive portions of the first dielectric layer 2620 over the fin-shaped active region 205. The first dielectric layer 2620 is spaced apart from the cladding layers 214' and the STI structures 204a-204b by the dielectric liner 2610. In some other embodiments, after the conformal deposition of the dielectric liner 2610, portions of the dielectric liner 2610 formed over top surfaces of the hard mask layer 210 and the STI structures 204a-204b may be removed, thereby leaving portions of the dielectric liner 2610 extending along sidewalls of the fin-shaped active regions 205. That is, at least a portion of the top surfaces of the STI structures 204a-204b may not be covered by the dielectric liner 2610. In such embodiments, the first dielectric layer 2620 may be in direct contact with the STI structures 204a-204b. In some other embodiments, before forming the first dielectric layer 2620, an etching process may be performed to etch back the dielectric liner 2610. For example, the etching process may remove portions of the dielectric liner 2610 formed on the top surfaces of the hard mask layer 210 and the isolation structures 204a-204b, leaving a remaining portion extending along sidewalls of the cladding layers 214'.

Figures 26A, 26B:
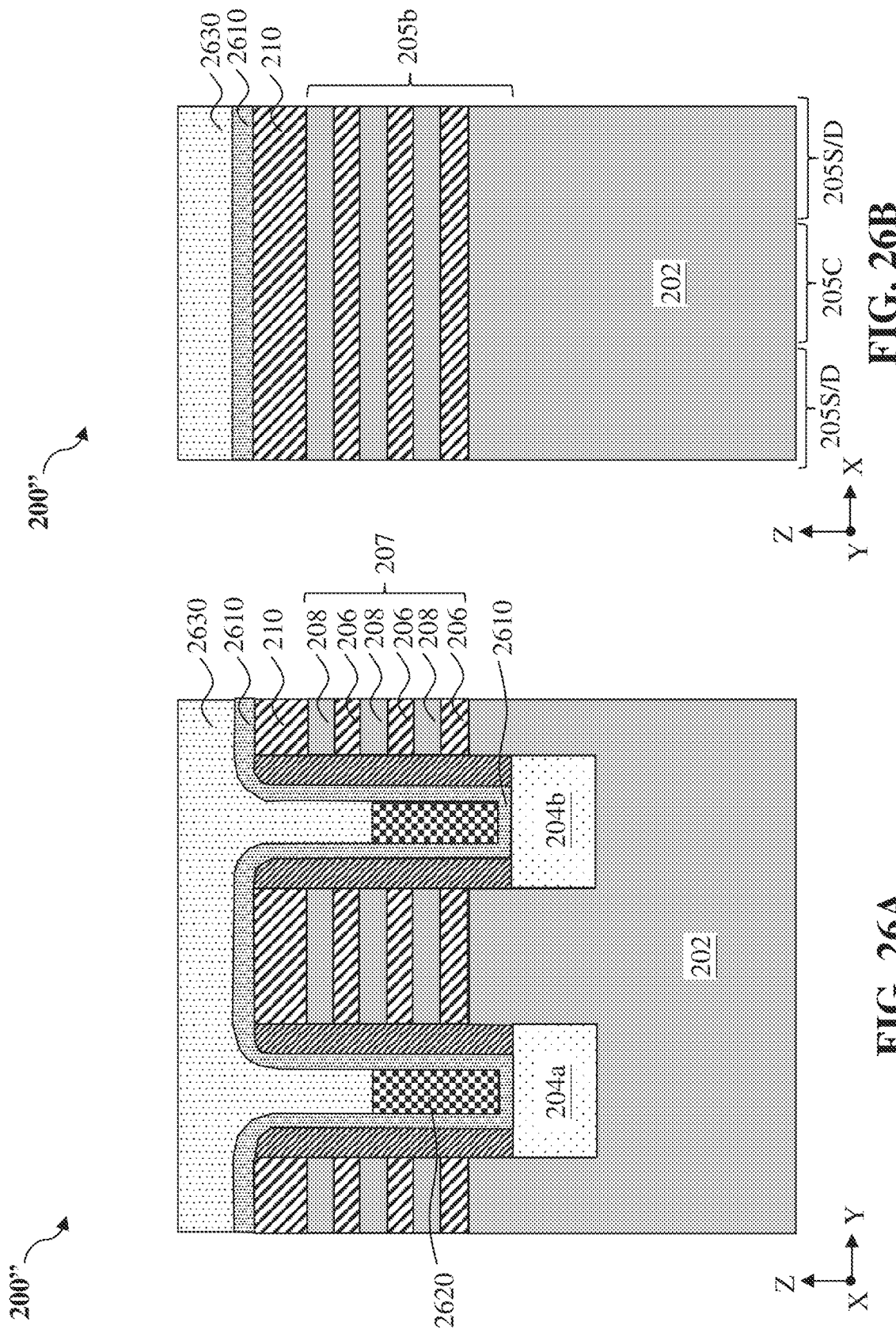

Referring to FIGS. 23, 26A, and 26B, block 106" includes a third block 106-3 where a second dielectric layer 2630 is deposited over the workpiece 200" to substantially fill the rest of the trench 212. That is, the second dielectric layer 2630 is deposited over and in direct contact with the first dielectric layer 2620 and the dielectric liner 2610. The formation and composition of the second dielectric layer 2630 may be in a way similar to those of the dielectric layer 216 shown in FIG. 6A. In some embodiments, both the second dielectric layer 2630 and the dielectric liner 2610 may be formed of a same material such as SiOC. Thus, the SiCN-formed first dielectric layer 2620 is embedded in the SiOC-formed second dielectric layer 2630 and the dielectric liner 2610. It is noted that the second dielectric layer 2630 and the dielectric liner 2610 may be formed of different materials.

Figure 27B:
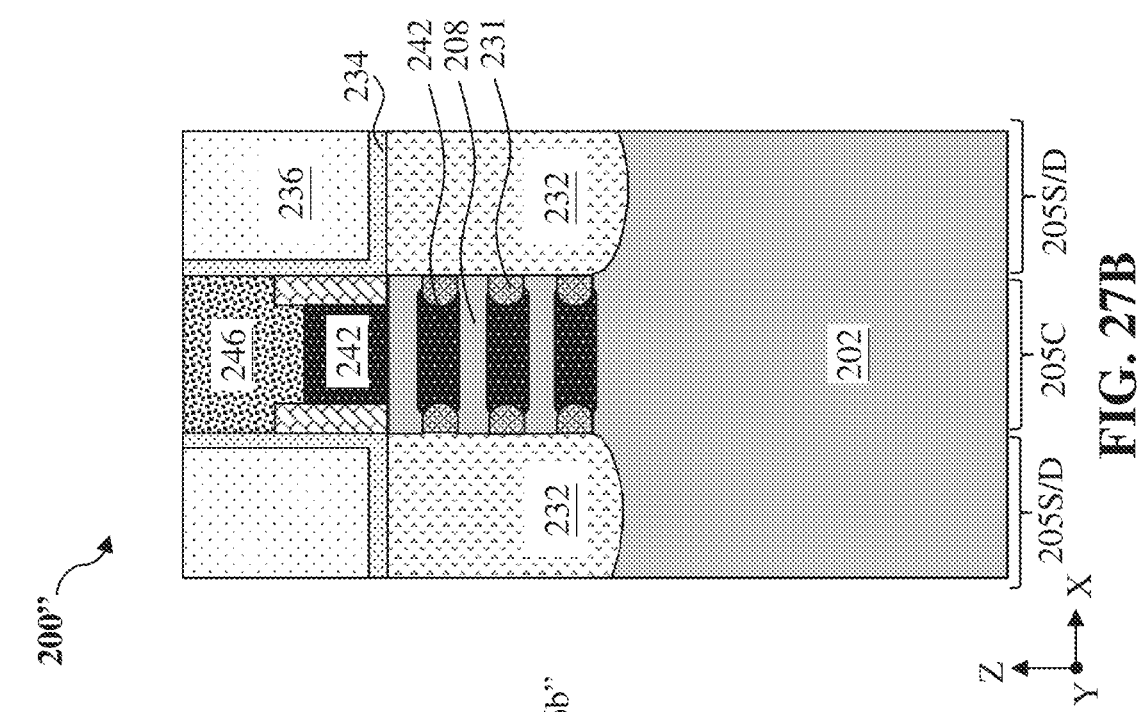
Figure 27A:
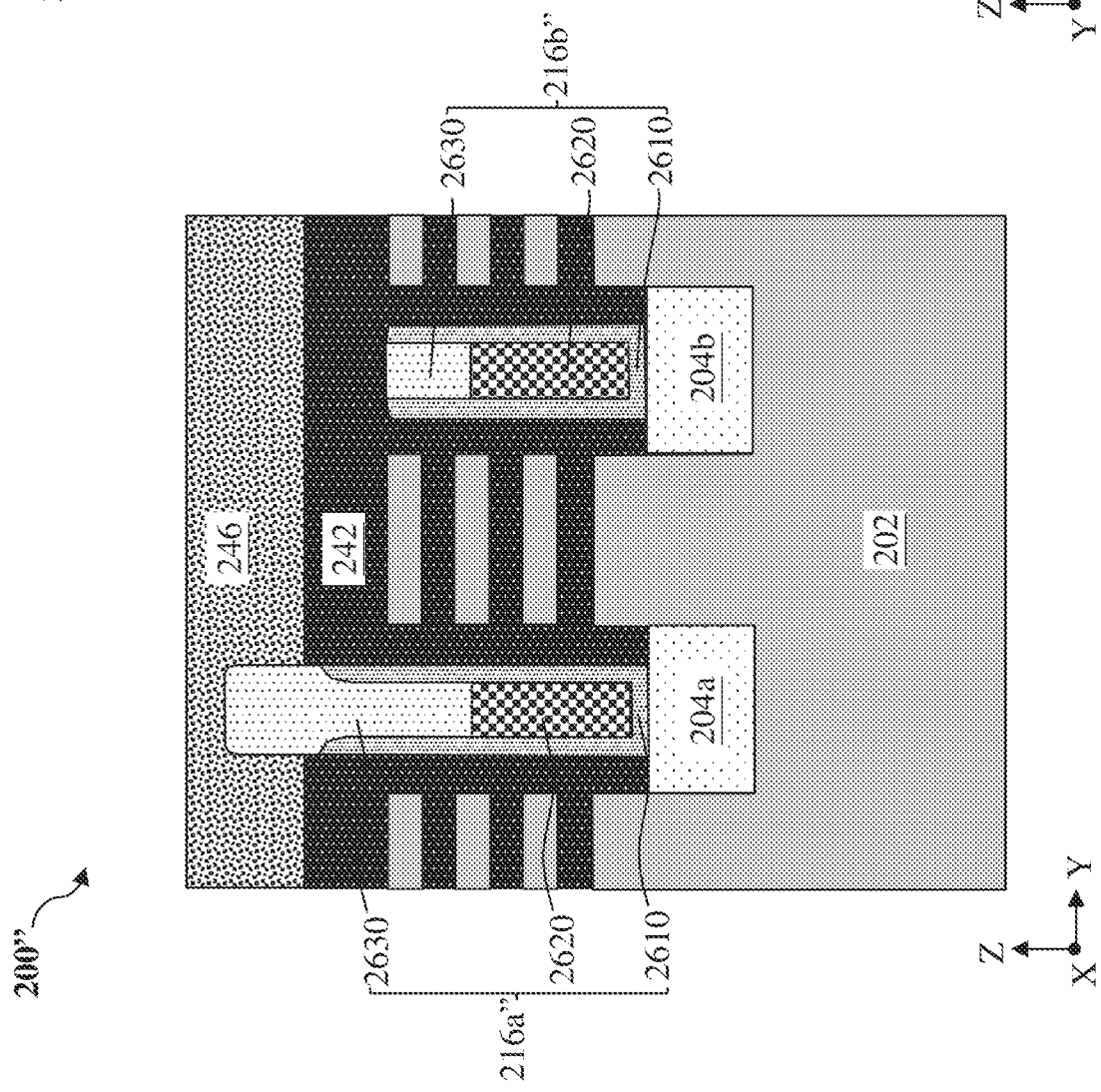

After performing the operations in block 106", method 100" moves to blocks 108-124 in method 100 of FIG. 1, thereby forming the workpiece 200" shown in FIGS. 27A and 27B. In the present embodiments, after performing the etching process 220 to the second dielectric layer 2630 and after optionally trimming the second dielectric layer 2630, an isotropic dry etching process may be performed to selectively remove a portion of the dielectric liner 2610 formed on the top surface of the hard mask layer 210, thereby exposing the top surface of the hard mask layer 210. The hard mask layer 210 and the cladding layers 214' may be then selectively removed in a sequential order. As exemplary shown in FIG. 27A, the workpiece 200" includes a first dummy fin 216a" formed over the first STI structure 204a and a second dummy fin 216b" formed over the second STI structure 204b. In the present embodiments, the first dummy fin 216a" includes the first dielectric layer 2620 spaced apart from the metal gate stack 242 and the first STI structure 204a by the dielectric liner 2610. A lower portion of the second dielectric layer 2630 is spaced apart from the metal gate stack 242 by the dielectric liner 2610, and an upper portion of the second dielectric layer 2630 protrudes from the metal gate stack 242. Sidewall surfaces of the first dielectric layer 2620 and at least portions of sidewall surfaces second dielectric layer 2630 in the first and second dummy fin 216a"-216b" may be lined by the dielectric liner 2610. In embodiments where both the second dielectric layer 2630 and the dielectric liner 2610 are formed of a same material such as SiOC, the first dielectric layer 2620 is embedded in the SiOC-formed second dielectric layer 2630 and the dielectric liner 2610.

Although not intended to be limiting, one or more embodiments of the present disclosure provide many benefits to a semiconductor device and the formation thereof. For example, the present disclosure provides a dummy fin structure disposed between two adjacent active regions and configured to have a satisfactory height to either cut or not cut a metal gate structure into multiple pieces to fulfill different design requirements. In some embodiments, the dummy fin structure is formed before the forming of the dummy gate structure, thereby reducing loading effect and providing a simplified method for forming a first dummy fin structure that has a top surface above a top surface of the metal gate structure and a second dummy fin structure that has a top surface below the top surface of the metal gate structure. Also, the process environment during the etching processes used to remove the dummy gate structure and release the channel members may be simplified. In some embodiments, besides offering scaling capability to accommodate fabrication of devices at advanced technology nodes, the dummy fin structure configured with one or more low-k dielectric materials (e.g., SiC-based materials) allows reduction of the parasitic capacitance between adjacent active regions as well as resistance against potential etching damage, thereby improving the overall performance of the devices (e.g., higher electrical breakdown voltage and good thermal stability). Using the low-k dielectric materials may also advantageously reduce cost associated with device fabrication. Embodiments of the disclosed methods can be readily integrated into existing processes and technologies for manufacturing GAA transistors, FinFETs, and/or other suitable devices.

The present disclosure provides for many different embodiments. Semiconductor structures and methods of fabrication thereof are disclosed herein. In one exemplary aspect, the present disclosure is directed to a method. The method includes providing a workpiece including a first active region and a second active region protruding from a substrate and spaced by a first trench, and cladding layers extending along sidewalls of the first active region and the second active region, wherein the cladding layers partially fill the first trench. The method also includes forming a dielectric layer over the workpiece to substantially fill the first trench, after the forming of the dielectric layer, forming a mask film directly on a portion of the dielectric layer in the first trench, after the forming of the mask film, selectively recessing the dielectric layer to form a dummy fin in and protruding from the first trench, performing an etching process to selectively remove the cladding layers to form second trenches, and forming a gate structure over the workpiece to fill the second trenches.

In some embodiments, the method may also include, after the forming of the gate structure, forming source/drain features over the workpiece and replacing the gate structure with a metal gate stack. A top surface of the dummy fin may be above a top surface of the metal gate stack. In some embodiments, the replacing the gate structure with the metal gate stack may include performing an etching process to selectively remove the gate structure without substantially etching the dummy fin. In some embodiments, the method may also include, after the performing of the etching process, selectively removing the mask film, and performing another etching process to trim a portion of the dummy fin that protrudes from the first trench. In some embodiments, the etching process may be performed after the forming of the dummy fin. In some embodiments, the first active region and the second active region each may include a vertical stack of alternating channel layers and sacrificial layers, and the performing of the etching process may remove the cladding layers while not substantially etching the channel layers and sacrificial layers. In some embodiments, the method may also include, after the forming of the gate structure, recessing regions of the first active region and the second active region that are not covered by the gate structure to form source/drain trenches, selectively recessing the sacrificial layers to form inner spacer recesses, forming inner spacer features in the inner spacer recesses, and forming source/drain features in the source/drain trenches. In some embodiments, the forming of the dielectric layer over the workpiece may include forming a conformal dielectric liner over the workpiece to partially fill the first trench, forming a first dielectric filler over the workpiece to substantially fill a bottom portion of the first trench, and forming a second dielectric filler over the workpiece to substantially fill an upper portion of the first trench. In some embodiments, a composition of the second dielectric filler may be the same as a composition of the conformal dielectric liner, and a composition of the first dielectric filler may be different from a composition of the conformal dielectric liner.

In another exemplary aspect, the present disclosure is directed to a method. The method includes providing a first semiconductor fin, a second semiconductor fin, and a third semiconductor fin each protruding from a substrate and oriented lengthwise in a first direction, forming a dielectric feature over the substrate to fill space between the first and second semiconductor fins and space between the second and third semiconductor fins, selectively recessing the dielectric feature to form a first isolation feature between the first and second semiconductor fins and a second isolation feature between the second and third semiconductor fins, wherein a height of the first isolation feature is greater than a height of the second isolation feature, after the forming of the first and second isolation features, forming a placeholder gate over the first, second, and third semiconductor fins, wherein the first and the second isolation features are embedded in the placeholder gate, forming source/drain features, selectively removing the placeholder gate without substantially etching the first and second isolation features, and forming a metal gate stack over the substrate, wherein a top surface of the first isolation feature is above a top surface of the metal gate stack, and a top surface of the second isolation feature is below a top surface of the metal gate stack.

In some embodiments, the method may also include before the forming of the dielectric feature, forming cladding layers extending along sidewalls of the first, second, and third semiconductor fins, and, before the forming of the placeholder gate, selectively removing the cladding layers. In some embodiments, the cladding layers may include aluminum oxide or silicon germanium. In some embodiments, a germanium concentration of the cladding layer may be different than a germanium concentration of a semiconductor layer of the first, second, and third semiconductor fins. In some embodiments, the height of the second isolation feature may be substantially equal to a height of the first, second, and third semiconductor fins. In some embodiments, the method may also include, before the selectively recessing of the dielectric feature, forming a patterned mask film directly over a portion of the dielectric feature disposed between the first and second semiconductor fins, and after the selectively recessing of the dielectric feature, selectively removing the patterned mask film. In some embodiments, the forming of the dielectric feature over the substrate may include depositing a first dielectric layer over the substrate to fill bottom portions of the space between the first and second semiconductor fins and space between the second and third semiconductor fins and depositing a second dielectric layer over the substrate to fill upper portions of the space between the first and second semiconductor fins and space between the second and third semiconductor fins. The selectively recessing of the dielectric feature may include selectively recessing the second dielectric layer, and the selectively recessing of the dielectric feature may stop before reaching a top surface of the first dielectric layer. In some embodiments, the first, second, and third semiconductor fins each may include a vertical stack of alternating first semiconductor layers and second semiconductor layers that are different from the first semiconductor layers.

In yet another exemplary aspect, the present disclosure is directed to a semiconductor structure. The semiconductor structure includes a first plurality of channel members over a substrate, a second plurality of channel members over the substrate, a third plurality of channel members over the substrate, a gate structure wrapping around the first, second, and third plurality of channel members, a first dummy fin disposed between the first plurality of channel members and the second plurality of channel members, and a second dummy fin disposed between the second plurality of channel members and the third plurality of channel members. A top surface of the first dummy fin is above a top surface of the gate structure, and a top surface of the second dummy fin is below a top surface of the gate structure.

In some embodiments, the first dummy fin may include silicon carbide (SiC), silicon oxycarbide (SiOC), silicon carbon oxynitride (SiOCN), silicon carbonitride (SiCN), hafnium oxide ($HfO_2$), or aluminum oxide ($Al_2O_3$). In some embodiments, the first dummy fin may include a first dielectric layer embedded in a second dielectric layer, and a dielectric constant of the second dielectric layer may be different from a dielectric constant of the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a workpiece comprising:
a first active region and a second active region protruding from a substrate and spaced by a first trench, and
cladding layers extending along sidewalls of the first active region and the second active region, wherein the cladding layers partially fill the first trench;
forming a dielectric layer over the workpiece to substantially fill the first trench;
after the forming of the dielectric layer, forming a mask film directly on a portion of the dielectric layer in the first trench;
after the forming of the mask film, selectively recessing the dielectric layer to form a dummy fin in and protruding from the first trench;
performing an etching process to selectively remove the cladding layers to form second trenches; and
forming a gate structure over the workpiece to fill the second trenches.

2. The method of claim 1, further comprising:
after the forming of the gate structure, forming source/drain features over the workpiece; and
replacing the gate structure with a metal gate stack,
wherein a top surface of the dummy fin is above a top surface of the metal gate stack.

3. The method of claim 2, wherein the replacing the gate structure with the metal gate stack comprises performing an etching process to selectively remove the gate structure without substantially etching the dummy fin.

4. The method of claim 1, further comprising:
after the performing of the etching process, selectively removing the mask film; and
performing another etching process to trim a portion of the dummy fin that protrudes from the first trench.

5. The method of claim 1, wherein the etching process is performed after the forming of the dummy fin.

6. The method of claim 1,
wherein the first active region and the second active region each includes a vertical stack of alternating channel layers and sacrificial layers, and
wherein the performing of the etching process removes the cladding layers while not substantially etching the channel layers and sacrificial layers.

7. The method of claim 6, further comprising:
after the forming of the gate structure, recessing regions of the first active region and the second active region that are not covered by the gate structure to form source/drain trenches;
selectively recessing the sacrificial layers to form inner spacer recesses;
forming inner spacer features in the inner spacer recesses; and
forming source/drain features in the source/drain trenches.

8. The method of claim 1, wherein the forming of the dielectric layer over the workpiece comprises:
forming a conformal dielectric liner over the workpiece to partially fill the first trench;
forming a first dielectric filler over the workpiece to substantially fill a bottom portion of the first trench; and
forming a second dielectric filler over the workpiece to substantially fill an upper portion of the first trench.

9. The method of claim 8, wherein a composition of the second dielectric filler is the same as a composition of the conformal dielectric liner, and a composition of the first dielectric filler is different from a composition of the conformal dielectric liner.

10. A method, comprising:
providing a first semiconductor fin, a second semiconductor fin, and a third semiconductor fin each protruding from a substrate and oriented lengthwise in a first direction;
forming a dielectric feature over the substrate to fill space between the first and second semiconductor fins and space between the second and third semiconductor fins;
selectively recessing the dielectric feature to form a first isolation feature between the first and second semiconductor fins and a second isolation feature between the second and third semiconductor fins, wherein a height of the first isolation feature is greater than a height of the second isolation feature;
after the forming of the first and second isolation features, forming a placeholder gate over the first, second, and third semiconductor fins, wherein the first and the second isolation features are embedded in the placeholder gate;
forming source/drain features;
selectively removing the placeholder gate without substantially etching the first and second isolation features; and
forming a metal gate stack over the substrate, wherein a top surface of the first isolation feature is above a top surface of the metal gate stack, and a top surface of the second isolation feature is below a top surface of the metal gate stack.

11. The method of claim 10, further comprising:
before the forming of the dielectric feature, forming cladding layers extending along sidewalls of the first, second, and third semiconductor fins; and
before the forming of the placeholder gate, selectively removing the cladding layers.

12. The method of claim 11, wherein the cladding layers comprise aluminum oxide or silicon germanium.

13. The method of claim 12, wherein a germanium concentration of the cladding layers is different than a germanium concentration of a semiconductor layer of the first, second, and third semiconductor fins.

14. The method of claim 10, wherein the height of the second isolation feature is substantially equal to a height of the first, second, and third semiconductor fins.

15. The method of claim 10, further comprising:
before the selectively recessing of the dielectric feature, forming a patterned mask film directly over a portion of the dielectric feature disposed between the first and second semiconductor fins; and
after the selectively recessing of the dielectric feature, selectively removing the patterned mask film.

16. The method of claim 10, wherein the forming of the dielectric feature over the substrate comprises:
depositing a first dielectric layer over the substrate to fill bottom portions of the space between the first and second semiconductor fins and space between the second and third semiconductor fins; and depositing a second dielectric layer over the substrate to fill upper portions of the space between the first and second semiconductor fins and space between the second and third semiconductor fins, wherein the selectively recessing of the dielectric feature includes selectively recessing the second dielectric layer, and the selectively recessing of the dielectric feature stops before reaching a top surface of the first dielectric layer.

17. The method of claim 10, wherein the first, second, and third semiconductor fins each includes a vertical stack of alternating first semiconductor layers and second semiconductor layers that are different from the first semiconductor layers.

18. A semiconductor structure, comprising:
- a first plurality of channel members over a substrate;
- a second plurality of channel members over the substrate;
- a third plurality of channel members over the substrate;
- a gate structure wrapping around the first, second, and third plurality of channel members;
- a first dummy fin disposed between the first plurality of channel members and the second plurality of channel members; and
- a second dummy fin disposed between the second plurality of channel members and the third plurality of channel members,
- wherein a top surface of the first dummy fin is above a top surface of the gate structure, and a top surface of the second dummy fin is below a top surface of the gate structure.

19. The semiconductor structure of claim 18, wherein the first dummy fin comprises silicon carbide (SiC), silicon oxycarbide (SiOC), silicon carbon oxynitride (SiOCN), silicon carbonitride (SiCN), hafnium oxide ($HfO_2$), or aluminum oxide ($Al_2O_3$).

20. The semiconductor structure of claim 18, wherein the first dummy fin comprises a first dielectric layer embedded in a second dielectric layer, and a dielectric constant of the second dielectric layer is different from a dielectric constant of the first dielectric layer.

* * * * *